United States Patent
Kumaki et al.

(10) Patent No.: US 9,773,989 B2
(45) Date of Patent: Sep. 26, 2017

(54) METHOD FOR PRODUCING METAL THIN FILM AND CONDUCTIVE STRUCTURE

(71) Applicant: National University Corporation Yamagata University, Yamagata-shi, Yamagata (JP)

(72) Inventors: Daisuke Kumaki, Yamagata (JP); Tomohito Sekine, Yamagata (JP); Shizuo Tokito, Yamagata (JP); Kenjiro Fukuda, Yamagata (JP)

(73) Assignee: NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 0 days.

(21) Appl. No.: 15/101,697

(22) PCT Filed: Sep. 11, 2014

(86) PCT No.: PCT/JP2014/004723
§ 371 (c)(1),
(2) Date: Jun. 3, 2016

(87) PCT Pub. No.: WO2015/083307
PCT Pub. Date: Jun. 11, 2015

(65) Prior Publication Data
US 2016/0372693 A1      Dec. 22, 2016

(30) Foreign Application Priority Data
Dec. 3, 2013 (JP) .................................. 2013-249731

(51) Int. Cl.
*H05K 1/03* (2006.01)
*H05K 1/02* (2006.01)
(Continued)

(52) U.S. Cl.
CPC .......... *H01L 51/055* (2013.01); *B22F 1/0018* (2013.01); *B22F 3/1017* (2013.01);
(Continued)

(58) Field of Classification Search
CPC .. H05K 1/0313; H05K 1/0296; B22F 1/0018; B22F 3/1017
See application file for complete search history.

(56) References Cited

U.S. PATENT DOCUMENTS 2,851,380 A * 9/1958 Berlinghof, Jr. ......... H01B 1/22
                                                          29/851
5,922,397 A * 7/1999 Brandt ..................... C25D 5/54
                                                          205/125
(Continued)

FOREIGN PATENT DOCUMENTS

| JP | 2001-313452 | 11/2001 |
| JP | 2003-021826 | 1/2003 |

(Continued)

OTHER PUBLICATIONS

Hummelgard et al., "Electrical Sintering of Silver Nanoparticle Ink Studied by In-Situ TEM Probing", Feb. 2011, Plos One, vol. 6, Issue 2, 6 pages.*

(Continued)

*Primary Examiner* — Evan Pert
(74) *Attorney, Agent, or Firm* — Hamre, Schumann, Mueller & Larson, P.C.

(57) ABSTRACT

The metal thin film production method of the present invention includes, in the following order, the steps of: preparing a substrate (1) having thereon an underlayer (2) formed of an insulating resin; subjecting a surface of the underlayer (2) to a physical surface treatment for breaking bonds of organic molecules constituting the insulating resin; subjecting the substrate (1) to a heat treatment at a tempera- (Continued)

ture of 200° C. or lower; applying a metal nanoparticle ink to the underlayer (2); and sintering metal nanoparticles contained in the metal nanoparticle ink at a temperature equal to or higher than a glass transition temperature of the underlayer (2). A fused layer (4) having a thickness of 100 nm or less is formed between the underlayer (2) and a metal thin film (3) formed by sintering the metal nanoparticles.

17 Claims, 23 Drawing Sheets

(51) Int. Cl.
  *B22F 3/10* (2006.01)
  *B22F 1/00* (2006.01)
  *B22F 7/04* (2006.01)
  *H01L 51/05* (2006.01)
  *C23C 24/10* (2006.01)
  *H05K 3/12* (2006.01)
  *H01L 51/00* (2006.01)
  *H05K 1/09* (2006.01)
  *H05K 3/38* (2006.01)

(52) U.S. Cl.
  CPC .............. *B22F 7/04* (2013.01); *C23C 24/106* (2013.01); *H01L 51/0021* (2013.01); *H01L 51/0545* (2013.01); *H05K 3/1208* (2013.01); *H05K 1/036* (2013.01); *H05K 1/0393* (2013.01); *H05K 1/097* (2013.01); *H05K 3/381* (2013.01)

(56) References Cited

U.S. PATENT DOCUMENTS

| | | | |
|---|---|---|---|
| 7,005,673 B2 | 2/2006 | Kiyota et al. | |
| 7,267,926 B2 | 9/2007 | Tsuruta et al. | |
| 8,632,700 B2* | 1/2014 | Winoto | 252/512 |
| 8,916,796 B2* | 12/2014 | Ramanujan | B41J 3/407 219/121.6 |
| 2003/0146019 A1 | 8/2003 | Hirai | |
| 2004/0147113 A1* | 7/2004 | Yamazaki | H01L 21/288 438/660 |
| 2004/0191497 A1* | 9/2004 | Hiraoka | H01L 23/145 428/304.4 |
| 2005/0019203 A1* | 1/2005 | Saitoh | C22C 5/06 420/506 |
| 2005/0276933 A1* | 12/2005 | Prasad | H01L 21/288 428/1.1 |
| 2006/0045963 A1* | 3/2006 | Hirai | C23C 24/00 427/96.1 |
| 2006/0055722 A1* | 3/2006 | Hirai | B41J 29/393 347/19 |
| 2006/0159838 A1* | 7/2006 | Kowalski | B82Y 30/00 427/58 |
| 2006/0159899 A1* | 7/2006 | Edwards | H05K 3/12 428/209 |
| 2007/0267628 A1* | 11/2007 | Koo | H01L 51/102 257/40 |
| 2008/0105853 A1* | 5/2008 | Ueda | H01B 1/22 252/513 |
| 2009/0114958 A1* | 5/2009 | Nakazato | H01L 21/4867 257/288 |
| 2009/0258241 A1* | 10/2009 | Shiraishi | C09D 11/30 428/457 |
| 2009/0283304 A1* | 11/2009 | Winoto | B82Y 10/00 174/257 |
| 2010/0059251 A1* | 3/2010 | Remizov | H05K 3/107 174/250 |
| 2010/0068467 A1* | 3/2010 | Song | H05K 3/1208 428/172 |
| 2010/0127269 A1* | 5/2010 | Daniel | H01L 29/1606 257/66 |
| 2011/0168430 A1* | 7/2011 | Hata | H05K 3/389 174/126.1 |
| 2011/0180764 A1 | 7/2011 | Takahashi et al. | |
| 2012/0177897 A1* | 7/2012 | Jablonski | B22F 1/0022 428/208 |
| 2013/0273357 A1 | 10/2013 | Whitcomb et al. | |
| 2014/0178601 A1* | 6/2014 | Wei | C09D 11/52 427/553 |
| 2014/0255709 A1* | 9/2014 | Hasegawa | H05K 3/1208 428/457 |
| 2014/0308460 A1* | 10/2014 | Uchida | H05K 3/105 427/557 |
| 2015/0173200 A1* | 6/2015 | Kim | H05K 3/207 216/20 |
| 2015/0289384 A1* | 10/2015 | Iwashita | H05K 3/185 174/250 |
| 2015/0368494 A1* | 12/2015 | Zhang | C09B 57/004 252/514 |
| 2016/0072068 A1* | 3/2016 | Okamoto | H01L 51/0022 257/40 |
| 2017/0178946 A1* | 6/2017 | Zenou | H01L 21/705 |

FOREIGN PATENT DOCUMENTS

| | | |
|---|---|---|
| JP | 2004-143571 | 5/2004 |
| JP | 2004-175646 | 6/2004 |
| JP | 2010-118168 | 5/2010 |
| JP | 2010-160989 | 7/2010 |
| JP | 2010-245064 | 10/2010 |
| JP | 2011-068815 | 4/2011 |
| JP | 5108628 B | 12/2012 |
| JP | 2013-020942 | 1/2013 |
| WO | 2010/038570 | 4/2010 |

OTHER PUBLICATIONS

Hegemann et al., "Plasma Treatment of Polymers for Surface and Adhesion Improvement", Jan. 2003, Nuclear Instruments and Methods in Physics Research B 208, (2003), pp. 281-286.*
Author and Date Unknown, "Common Bond Energies" downloaded from http://www.wiredchemist.com/chemistry/data/bond_energies_lengths.html.*
Wu et al., "Functional Polymer Coatings: Principles, Methods, and Applications"—Chapter Entitled "Self-Stratifying Polymers and Coatings", p. 202.*
Author and date unknown, "Polymer Properties DataBase" downloaded from http://polymerdatabase.com/polymer%20physics/Polymer%20Tg.html, 10 pages.*
Mitsuo et al., JP 2010-160989, English Mahine Translation, Jul. 2010, 28 pages.*

* cited by examiner

METHOD FOR PRODUCING METAL THIN FILM AND CONDUCTIVE STRUCTURE

TECHNICAL FIELD

The present invention relates to a method for producing a metal thin film and to a conductive structure. The present invention relates particularly to a metal thin film that is formed using a conductive ink containing metal nanoparticles dispersed therein and is suitable for formation of conductive lines and fabrication of thin-film transistor integrated circuits.

BACKGROUND ART

In recent years, printed electronics using printing technology have attracted attention in the field of electronic devices. In particular, conductive inks are recognized as one of industrially very important technologies because conductive lines can be formed by applying conductive inks by coating processes and such coating processes can provide a more significant reduction in cost and environmental impact than conventional vacuum processes. Thus, materials for such conductive inks are under active development.

An example of conventional conductive inks is a metal paste obtained by mixing metal particles having a size on the order of micrometers with a binder resin and a solvent. Such metal pastes are widely used in electronic products such as printed circuit boards. The metal pastes, however, must be sintered at 200° C. to 300° C. to exhibit electrical conductivity. Therefore, how to achieve high electrical conductivity by sintering at lower temperatures is a challenge to be addressed. In addition, due to their high viscosities, conventional metal pastes cannot be used in certain printing techniques such as inkjet printing.

In order to solve these problems, there have been recently developed metal nanoparticle inks capable of exhibiting high electrical conductivities of $10^{-5}$ $\Omega \cdot cm$ or less when sintered at temperatures of 150° C. or lower. Metal nanoparticles contained in such an ink have a structure in which a metal in the form of nanoparticles is coated with protective organic molecules acting as a surfactant. The action of the protective organic molecules allows the metal nanoparticles to be dispersed relatively stably in various organic solvents. Some of the protective organic molecules are desorbed from the metal nanoparticles even at room temperature. Therefore, the resulting metal nanoparticles are readily sintered together and thus exhibit high electrical conductivity even when sintered at low temperatures. With the use of metal nanoparticles having such characteristics, it is possible to use a low-temperature process to form an electronic circuit even on a plastic film having a low heat-resistance temperature.

On the other hand, when such a conductive ink is used to form conductive lines of an electronic circuit, the adhesion between the conductive lines and a substrate is an important factor to ensure the reliability of the resulting product. Since conventional metal pastes contain a binder resin having a molecular structure that enhances the adhesion between conductive lines and a substrate, they can provide strong adhesion between them. In addition, since such conventional metal pastes are resistant to high-temperature sintering, they have an advantage of being able to provide better adhesion between the conductive lines and the substrate. In contrast, metal nanoparticles contain fewer protective organic molecules. Therefore, such metal nanoparticles exhibit high electrical conductivity even at low temperatures, but the use of such metal nanoparticles makes it difficult to enhance the adhesion between conductive lines and a substrate. So in order to form highly reliable conductive lines, improvement of adhesion between a substrate and conductive lines formed using metal nanoparticles is a challenge to be addressed.

There have been many studies and some proposals to enhance the adhesion between substrates and metal thin films formed using metal nanoparticle inks. For example, Patent Literature 1 describes a method for sintering a metal nanoparticle ink by irradiating the ink with a laser beam. Patent Literature 2 describes the formation of a thin film from a metal fine powder paste on a glass substrate which has been surface-treated with a silane coupling agent. Patent Literature 3 describes the use of metal nanoparticles containing a linear epoxy resin.

CITATION LIST

Patent Literature

Patent Literature 1: JP 5108628 B2
Patent Literature 2: JP 2004-175646 A
Patent Literature 3: JP 2010-118168 A

SUMMARY OF INVENTION

Technical Problem

The method described in Patent Literature 1, however, is not suitable for formation of fine conductive lines because it is difficult to maintain strict control to reduce damage to the substrate. Substrates that can be used in the method described in Patent Literature 2 are limited to substrates made of materials, such as glass, that can be bonded with a silane coupling agent. Therefore, more versatile methods are required. The metal nanoparticle ink described in Patent Literature 3 contains a binder resin having high bonding strength to a substrate. Therefore, the method described in Patent Literature 3 presumably enhances the adhesion between the metal thin film and the substrate but causes concern about a decrease in the electrical conductivity of the metal thin film due to the binder resin.

Therefore, it is desired to improve the adhesion between a substrate and a metal thin film when the metal thin film is formed using a metal nanoparticle ink.

The present invention has been made to solve the above problems, and it is an object of the present invention to provide a technique for enhancing the adhesion between a substrate and a metal thin film formed using a metal nanoparticle ink.

Solution to Problem

That is, the present invention provides a method for producing a metal thin film, including, in the following order, the steps of:

preparing a substrate having thereon an underlayer formed of an insulating resin;

subjecting a surface of the underlayer to a physical surface treatment for breaking bonds of organic molecules constituting the insulating resin;

subjecting the substrate to a heat treatment at a temperature of 200° C. or lower;

applying a metal nanoparticle ink to the underlayer; and sintering metal nanoparticles contained in the metal nanoparticle ink at a temperature equal to or higher than a glass transition temperature of the underlayer.

In another aspect, the present invention provides a conductive structure including:
a substrate having thereon an underlayer formed of an insulating resin;
a metal thin film supported on the underlayer; and
a fused layer formed between the underlayer and the metal thin film and having a thickness of 100 nm or less, the metal thin film being formed by the method described above.

Advantageous Effects of Invention

According to the above-described method, it is possible to enhance the adhesion between a substrate and a metal thin film formed from a metal nanoparticle ink. Therefore, the metal thin film formed by the method of the present invention enhances the reliability of conductive lines. In particular, the stability of the conductive lines against mechanical stress is improved.

The above-described conductive structure includes a fused layer formed between an underlayer and a metal thin film and having a thickness of 100 nm or less. The fused layer enhances the adhesion between the underlayer and the metal thin film.

DESCRIPTION OF EMBODIMENTS

Hereinafter, the present invention will be described in more detail. The present invention is not limited to the following embodiments.

Figure 1A:
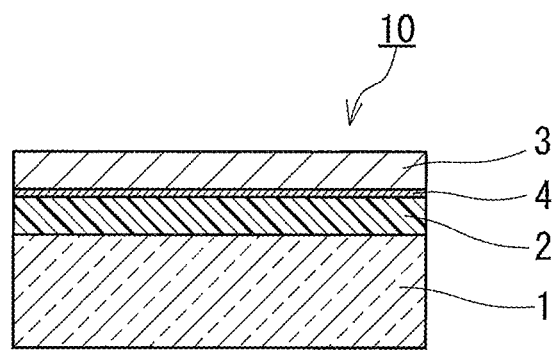
FIG. 1A is a schematic cross-sectional view of a conductive structure according to an embodiment of the present invention.

As shown in FIG. 1A, a conductive structure 10 of the present embodiment includes a substrate 1, an underlayer 2, and a metal thin film 3. The underlayer 2 is a layer formed on the substrate 1 (base) and is made of an insulating resin. The metal thin film 3 (thin film electrode) is a layer (sintered layer) formed by applying a metal nanoparticle ink to the surface of the underlayer 2 and sintering metal nanoparticles contained in the ink. A fused layer 4 is formed between the underlayer 2 and the metal thin film 3. The fused layer 4 is a layer containing the insulating resin forming the underlayer 2 and metal atoms constituting the metal thin film 3. The fused layer 4 serves to enhance the adhesion between the underlayer 2 and the metal thin film 3. Hereinafter, a method for producing the conductive structure 10 is described in detail.

First, the substrate 1 is prepared. The material of the substrate 1 is not particularly limited. The material may be an inorganic material such as glass, ceramics, or metal, or an organic material such as resin. In the present embodiment, the metal thin film 3 is formed using a metal nanoparticle ink. The metal nanoparticles contained in the ink can be sufficiently sintered at low temperatures. In the present embodiment, all the necessary heat treatments can be performed at temperatures of 200° C. or lower. Therefore, a resin film or the like having a low heat-resistance temperature can also be used as the substrate 1. The substrate 1 may be a flexible substrate like a resin film.

Even in the case where the substrate 1 is a resin film, it is effective to form the underlayer 2 on the substrate 1. The underlayer 2 thus formed can improve the smoothness and/or wettability of the surface to which the metal nanoparticle ink is to be applied. In the case where both the substrate 1 and the underlayer 2 are made of resin, good adhesion is achieved between them. It should be noted, however, that in the case where the substrate 1 is a resin film, the surface layer of the substrate 1 can be regarded as the underlayer 2. In this case, it is not always necessary to form the underlayer 2 additionally on the substrate 1.

Next, the underlayer 2 is formed on the substrate 1. The underlayer 2 can be formed by applying a coating solution containing the insulating resin to the substrate 1 and drying the resulting coating film. The coating solution is obtained, for example, by dissolving the insulating resin in an appropriate solvent (typically, an organic solvent). The type of the solvent is not particularly limited. Examples of the solvent include toluene, xylene, mesitylene, decahydronaphthalene, N-methyl-2-pyrrolidone, anisole, $\gamma$-butyrolactone, chlorobenzene, dichlorobenzene, trichlorobenzene, tetralin, 1-methylnaphthalene, 1,4-diisopropylbenzene, diethylene glycol monobutyl ether, propylene glycol 1-monomethyl ether 2-acetate, and butyl acetate. The coating film may be dried by heating the substrate 1, or the coating film may be dried at room temperature. The heating temperature (ambient temperature) for drying the coating film is, for example, in a range of 30° C. to 200° C. When the substrate 1 is a resin film, the heating temperature is set at a temperature below the heat-resistance temperature of the substrate 1. The step of drying the coating film may be performed in ambient air or in an inactive gas such as nitrogen gas or rare gas. The underlayer 2 can also be formed on the substrate 1 by laminating an insulating resin film on the substrate 1.

The insulating resin forming the underlayer 2 is not particularly limited as long as it can be applied to the substrate 1. Examples of the insulating resin include thermoplastic resins such as polymethyl methacrylate (PMMA), polyvinyl phenol (PVP), polystyrene, polyvinyl alcohol, polyethylene, polypropylene, polycarbonate, polyethylene terephthalate, polyethylene naphthalate, polysulfone, polyether sulfone, polyarylate, polyamide, and thermoplastic fluororesins Examples of such thermoplastic fluororesins include polyvinylidene fluoride (PVdF), polytetrafluoroethylene (PTFE), tetrafluoroethylene-hexafluoropropylene copolymer (FEP), tetrafluoroethylene-perfluoroalkyl vinyl ether copolymer (PFA), ethylene-tetrafluoroethylene copolymer (ETDD), ethylene-chlorotrifluoroethylene copolymer (ECTFE), and polychlorotrifluoroethylene (PCTFE). Amorphous thermoplastic fluororesins also can be used. Examples of such amorphous thermoplastic fluororesins include CYTOP (registered trademark) available from Asahi Glass Co., Ltd. and Teflon (registered trademark) AF available from Du Pont-Mitsui Fluorochemicals Co., Ltd. As the insulating resin forming the underlayer 2, one selected from these thermoplastic resins may be used alone. Alternatively, a polymer alloy containing two or more selected from these thermoplastic resins may be used. It is more preferable to use a thermoplastic resin containing many OH groups in its molecular structure.

Preferably, the underlayer 2 has a glass transition temperature Tg of 200° C. or lower. The glass transition temperature Tg of the underlayer 2 means the glass transition temperature Tg of the material forming the underlayer 2. In the present embodiment, the glass transition temperature Tg of the underlayer 2 means the glass transition temperature Tg of the insulating resin forming the underlayer 2. Thus, it is preferable that the insulating resin used for the underlayer 2 have a glass transition temperature Tg of 200° C. or lower. With the use of an insulating resin having a glass transition temperature Tg of 200° C. or lower, it is possible to increase the adhesion of the surface of the underlayer 2 to the metal nanoparticle ink applied to the underlayer 2 by a heat treatment of the substrate 1 at a temperature of 200° C. or lower. The glass transition temperature Tg of the insulating resin is, for example, in a range of 40° C. to 200° C. As described previously, the insulating resin forming the underlayer 2 may be a mixture of a plurality of insulating resins having different glass transition temperatures Tg.

The glass transition temperature Tg of the insulating resin can be measured according to "Measurement method for transition temperatures of plastics" specified in Japanese Industrial Standards (JIS) K 7121 (2012). In this description, the glass transition temperature Tg refers to the midpoint glass transition temperature Tmg defined in JIS K 7121.

The method for applying the coating solution to the substrate 1 to form the underlayer 2 thereon is not particularly limited. The coating solution can be applied to the substrate 1 by a known coating or printing method. Examples of the coating method include spin coating, bar coating, and spray coating. Examples of the printing method include screen printing, gravure offset printing, letterpress reverse printing, and inkjet printing. These coating methods and printing methods can be performed using various types of coating machines and printing machines.

Preferably, the thickness of the underlayer 2 is 100 nm or more. The thickness of 100 nm or more ensures the adhesion between the substrate 1 and the underlayer 2 more easily. Therefore, it is possible to sufficiently increase the adhesion between the substrate 1 and the metal thin film 3 formed on the underlayer 2. In the present embodiment, fusion occurs at the interface between the underlayer 2 and the metal thin film 3. In other words, the fused layer 4 is formed between the underlayer 2 and the metal thin film 3. The fused layer 4 thus formed allows the metal thin film 3 to exhibit strong adhesion. Therefore, in order to form the sufficiently thick fused layer 4, the thickness of the underlayer 2 is preferably 100 nm or more. In the case where the underlayer 2 thus formed is subjected to an intense physical surface treatment, the underlayer 2 may be eroded. Therefore, it is preferable to form the underlayer 2 having a thickness large enough in anticipation of a decrease in the thickness by the physical surface treatment. On the other hand, the upper limit of the thickness of the underlayer 2 is not particularly limited unless, for example, the resistivity of a conductive line is significantly increased, conductive lines are broken, and the smoothness of the surface of the underlayer 2 is significantly reduced. The upper limit of the thickness of the underlayer 2 is, for example, 10 μm.

Next, the surface of the underlayer 2 is subjected to the physical surface treatment. The step of subjecting the surface of the underlayer 2 to the physical surface treatment can be an optional step that may be performed between the step of forming the underlayer 2 and the step of applying the metal nanoparticle ink. The adhesion of the metal thin film 3 can be further enhanced by performing the physical surface treatment. Specifically, the physical surface treatment applied to the surface of the underlayer 2 can be a treatment for breaking the bonds of organic molecules constituting the insulating resin. When the physical surface treatment is performed to break the bonds of organic molecules forming the surface layer of the underlayer 2, the wettability of the surface of the underlayer 2 is enhanced, presumably resulting in enhanced adhesion of the metal thin film 3.

More specifically, the physical surface treatment can be a treatment for breaking the bonds with bonding energies of 200 to 1000 kJ/mol. By subjecting the surface of the underlayer 2 to such a treatment for breaking only relatively weak bonds of organic molecules constituting the insulating resin, it is possible to increase the wettability of the surface of the underlayer 2 while maintaining the smoothness of the surface of the underlayer 2. It is also possible to enhance the adhesion between the underlayer 2 and the metal nanoparticle ink applied to the underlayer 2.

The physical surface treatment includes, for example, at least one treatment selected from the group consisting of a plasma treatment, an ultraviolet irradiation treatment, and an ultraviolet-ozone treatment. With this treatment method, it is easy to adjust the conditions of the physical surface treatment so as to break only relatively weak bonds as described above. It is also possible to perform the physical surface treatment with an intensity high enough to break the molecular bonds but low enough to maintain the smoothness of the surface of the underlayer 2. Examples of the plasma treatment include an oxygen plasma treatment, an argon plasma treatment, and a nitrogen plasma treatment. The duration of the physical surface treatment is, for example, 10 seconds to 5 minutes. The treatment for at least 10 seconds has the effect of the physical surface treatment. Since plasma stabilization takes about 15 seconds, it is desirable to set the duration of the plasma treatment to about 30 seconds so as to obtain the effect of the treatment uniformly in the plane.

After the physical surface treatment, the substrate 1 having the underlayer 2 is subjected to a heat treatment. This step can be an optional step that may be performed between the step of performing the physical surface treatment and the step of applying the metal nanoparticle ink. In this step, the heating temperature (ambient temperature) is, for example, 200° C. or lower. It is presumed that the heat treatment (annealing treatment) following the physical surface treatment enhances the lyophilicity of the surface of the underlayer 2 at the molecular level, and thus the contact area between the underlayer 2 and the surface of the metal nanoparticle ink applied to the underlayer 2 is increased, and the adhesion between the underlayer 2 and the metal thin film 3 is enhanced. In addition, the surface of the underlayer 2 is likely to be charged up by the physical surface treatment. When the charge on the surface of the underlayer 2 is removed by the heat treatment, the wettability of the surface of the underlayer 2 is enhanced, and as a result, the adhesion of the metal thin film 3 may be further enhanced.

In the heat treatment after the physical surface treatment, it is preferable to anneal the surface of the underlayer 2 at a temperature equal to or lower than the glass transition temperature Tg of the underlayer 2. Annealing treatment at such a temperature allows the adhesion between the underlayer 2 and the metal thin film 3 to be further enhanced. The lower limit of the temperature of the heat treatment (annealing temperature) is not particularly limited. The lower limit is, for example, 30° C., and preferably 50° C. Preferably, the annealing temperature is a temperature about 10° C. lower than the glass transition temperature Tg of the underlayer 2. For example, the annealing treatment can be performed at a temperature 10° C. to 50° C. lower than the glass transition temperature Tg of the underlayer 2. The duration of the annealing treatment is, for example, about 30 seconds to 60 minutes. The annealing treatment may be performed in ambient air or in an inactive gas such as nitrogen gas or rare gas.

Preferably, the surface energy (surface free energy) of the surface of the underlayer 2 is 15 mN/m or more after the annealing treatment and before the application of the metal nanoparticle ink. Preferably, the underlayer 2 has a surface energy in the above range so as to obtain good adhesion between the underlayer 2 and the metal nanoparticle ink applied to the underlayer 2 while ensuring the adhesion between the underlayer 2 and the substrate 1. The upper limit of the surface energy is not particularly limited. The upper limit is, for example, 80 mN/m.

The surface energy of the underlayer 2 can be measured by a known method. Specifically, droplets of two liquids (typically, water and methylene iodide) having known surface energies are placed on the surface of the underlayer 2, and the contact angles of these droplets are measured using a contact angle meter. The surface energy of the underlayer 2 can be calculated from the measurement results of these contact angles by the Owens-Wendt method or the like.

After the heat treatment, the metal nanoparticle ink is applied to the surface of the underlayer 2. Highly conductive nanoparticles are used as metal nanoparticles used for the metal nanoparticle ink because they are used to form the metal thin film 3. Examples of nanoparticles suitable for use as the metal nanoparticles include nanoparticles of a metal such as gold, silver, or copper. A known ink can be used as the metal nanoparticle ink. Specifically, the average particle diameter of the metal nanoparticles contained in the metal nanoparticle ink is, for example, in a range of 5 to 500 nm. The viscosity of the metal nanoparticle ink at room temperature (25° C.) is, for example 100 mPa·s or less, and typically in a range of 1 to 100 mPa·s. When the metal nanoparticle ink having a viscosity in this range is used, methods available for application of the metal nanoparticle ink to the underlayer 2 are less limited. The viscosities of typical conventional metal pastes are much higher than 100 mPa·s.

The average particle diameter of the metal nanoparticles can be calculated in the following manner. First, the metal nanoparticles are observed with an electron microscope (SEM or TEM). The square root of an area S of a specific metal nanoparticle in the resulting image is defined as a particle diameter a of that metal nanoparticle ($a=S^{1/2}$). The particle diameters a of randomly selected 50 metal nanoparticles are calculated. The average value of the particle diameters a thus calculated is defined as the average particle diameter of the primary particles of the metal nanoparticles. The viscosity of the metal nanoparticle ink can be measured, for example, according to "Measurement method for liquid viscosities" specified in Japanese Industrial Standards (JIS) Z 8803 (2011).

The method for applying the metal nanoparticle ink to the underlayer 2 also is not particularly limited. The metal nanoparticle ink can be applied to the underlayer 2 by a known coating or printing method. Examples of the coating method include spin coating, bar coating, and spray coating. Examples of the printing method include screen printing, gravure offset printing, flexographic printing, letterpress reverse printing, and inkjet printing. These coating methods and printing methods can be performed using various types of coating machines and printing machines.

The coating film containing the metal nanoparticles is formed on the underlayer 2 by applying the metal nanoparticle ink to the underlayer 2. The substrate 1 is heated at a temperature equal to or higher than the glass transition temperature Tg of the underlayer 2 (ambient temperature) so as to sinter the metal nanoparticles contained in the coating film. When the metal nanoparticles are sintered at such a temperature, the underlayer 2 and the metal thin film 3 (the sintered layer of the metal nanoparticles) are homogeneously fused together at the interface between them. Thus, the adhesion between the underlayer 2 and the metal thin film 3 is enhanced. The method of the present embodiment is easy and simple without requiring any complicated process. In the case where the sintering temperature is a temperature lower than the glass transition temperature Tg of the underlayer 2, the interfacial fusion as described above is less likely to occur. As a result, a gap is formed at the interface or the metal thin film 3 peels off, and thus sufficient adhesion cannot be obtained.

The upper limit of the sintering temperature of the metal nanoparticles is set at, for example, a temperature lower than the softening point of the underlayer 2, more specifically, a temperature lower than the softening point of the insulating resin forming the underlayer 2. In order to prevent distortion of a pattern of the metal thin film 3, deformation of the metal thin film 3, etc., the upper limit of the sintering temperature can be set at a temperature at least 30° C. lower than the softening point of the underlayer 2. There may be a case where the substrate 1 is made of a resin and the softening point of the substrate 1 (the softening point of the resin forming the substrate 1) is lower than the softening point of the underlayer 2. In this case, the upper limit of the sintering temperature is set at a temperature lower than (for example, a temperature at least 30° C. lower than) the softening point of the substrate 1. The upper limit of the temperature also applies to other steps that require heating. The metal nanoparticles may be sintered in ambient air or in an inactive gas such as nitrogen gas or rare gas.

The thickness of the metal thin film 3 also is not particularly limited. The thickness of the metal thin film 3 is, for example, 50 nm to 10 µm. When the thickness of the metal thin film 3 is in this range, components such as conductive lines and electrodes having sufficiently low resistivities can be formed.

According to the method of the present embodiment, the fused layer 4 can be formed at the interface between the underlayer 2 and the metal thin film 3. The fused layer 4 thus formed enhances the adhesion between the metal thin film 3 and the substrate 1. The fused layer 4 is a layer containing the insulating resin forming the underlayer 2 and metal atoms constituting the metal thin film 3. The presence of the fused layer 4 can be confirmed by observing the cross section of the conductive structure 10 with a transmission electron microscope (TEM). In some cases, the lattice image of the metal forming the metal thin film 3 can be observed in the fused layer 4 in the TEM image.

The upper limit of the thickness of the fused layer 4 is, for example, 100 nm. The lower limit of the thickness of the fused layer 4 is, for example, 10 nm. When the thickness of the fused layer 4 is in this range, the electrical conductivity of the metal thin film 3 having a thickness on the order of nanometers can be ensured sufficiently. In this description, the "thickness" refers to the average value of the thicknesses measured at some arbitrary points (for example, 10 points).

The underlayer 2, the fused layer 4, and the metal thin film 3 can be distinctively identified by the contrast of the TEM image. The presence of the fused layer 4 can also be confirmed by examining the elemental distribution in the depth direction of the conductive structure 10. Examples of the structure of the fused layer 4 include: (i) a structure in which the metal and the insulating resin are uniformly mixed; (ii) a structure in which the concentration of the metal decreases gradually in the thickness direction; and (iii) a structure including a region where the metal and the insulating resin are phase-separated and a region where the metal and the insulating resin are mixed. The fused layer 4 can be defined as a layer having one or more structures selected from the above-mentioned structures (i), (ii), and (iii) in a region with a thickness of 100 nm.

The conductive structure 10 of the present embodiment can be applied to various electronic devices such as thin-film transistors, integrated circuits including thin-film transistors, touch panels, RFIDs, and flexible displays. Since the metal thin film 3 of the conductive structure 10 is formed by sintering the metal nanoparticles, it exhibits a sufficiently low resistivity (for example, $3 \times 10^{-6}$ to $50 \times 10^{-6}$ Ω·cm). In the conductive structure 10 of the present embodiment, the adhesion between the metal thin film 3 and the underlayer 2 is enhanced by the fused layer 4. Therefore, with the use of the conductive structure 10, a highly reliable electronic component can be provided.

Figure 1B:
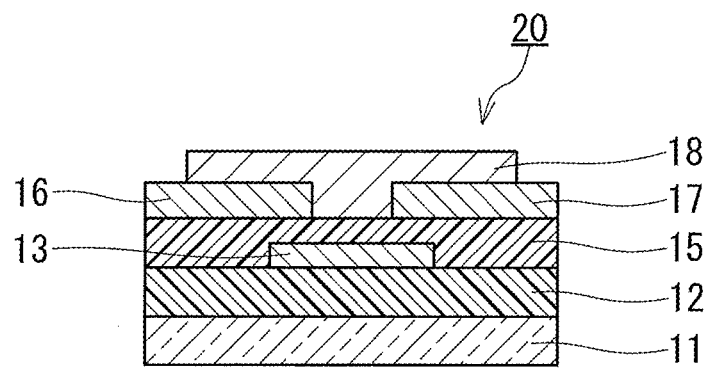
FIG. 1B is a schematic cross-sectional view of a thin-film transistor including the conductive structure shown in FIG. 1A.

As shown in FIG. 1B, a thin-film transistor 20 includes a substrate 11, an underlayer 12, a gate electrode 13, a gate insulating film 15, a source electrode 16, a drain electrode 17, and an organic semiconductor layer 18. The underlayer 12 is formed of an insulating resin. The gate electrode 13 is formed on the underlayer 12. The gate electrode 13 can be formed by applying a metal nanoparticle ink to the underlayer 12 and sintering the ink. The gate insulating film 15 covers the gate electrode 13. The source electrode 16 and the drain electrode 17 are formed on the gate insulating film 15. The source electrode 16 and the drain electrode 17 can be formed by applying a metal nanoparticle ink to the gate insulating film 15 and sintering the ink. That is, the thin-film transistor 20 includes the conductive structure described with reference to FIG. 1A. In FIG. 1B, the fused layer is not shown. The structure of the thin-film transistor is not limited to that shown in FIG. 1B. The conductive structure described in the present embodiment can be used in thin-film transistors having various structures.

EXAMPLES

Hereinafter, the present invention will be described more specifically based on examples. The present invention is not limited to the following examples.

Example 1

Polymethyl methacrylate (PMMA) (manufactured by Sigma Aldrich Japan Co.) was dissolved in mesitylene to obtain a coaling solution. The coating solution was applied to a blue plate glass substrate (soda lime glass substrate) by spin coating. The resulting coating film was annealed at 150° C. for 1 hour to form an underlayer with a thickness of 100 nm on the substrate. The surface of the underlayer was subjected to an oxygen plasma treatment using a plasma cleaner (PC-300, manufactured by SAMCO, Inc.) at an oxygen flow rate of 10 sccm (standard cubic centimeter per minute), 10 Pa, and 200 W for 10 seconds. Then, the substrate was placed on a hot plate and annealed at 40° C. (surface temperature of the hot plate) for 5 minutes in ambient air. Next, a silver nanoparticle ink (NPS-JL, manufactured by Harima Chemicals, Inc.) was applied to the underlayer by spin coating. The coating film of the silver nanoparticle ink was sintered at 150° C. (surface temperature of the hot plate) for 1 hour in ambient air to form an Ag thin film with a thickness of 100 nm. Thus, a conductive structure of Example 1 was obtained.

Example 2

An Ag thin film was formed in the same manner as in Example 1 except that polyvinyl phenol (PVP) (manufactured by Sigma Aldrich Japan Co.) was used as an insulating resin instead of polymethyl methacrylate (PMMA).

Examples 3 to 18

Ag thin films were each formed in the same manner as in Example 1 or Example 2 except that the annealing treatment was performed at temperatures shown in Table 1 below after the oxygen plasma treatment.

Reference Examples 1 and 2

Ag thin films were each formed in the same manner as in Example 1 or Example 2 except that the oxygen plasma treatment and the annealing treatment were not performed.

Reference Examples 3 and 4

Ag thin films were each formed in the same manner as in Example 1 or Example 2 except that the annealing treatment was not performed after the oxygen plasma treatment.

Comparative Examples 1 and 2

Ag thin films were each formed in the same manner as in Example 1 or Example 2 except that the oxygen plasma treatment and the annealing treatment were not performed and that the substrate was heated at a temperature of 120° C. (lower than the glass transition temperature of the underlayer) in the step of sintering silver nanoparticles.

Comparative Examples 3 and 4

Ag thin films were each formed in the same manner as in Example 1 or Example 2 except that the annealing treatment was not performed after the oxygen plasma treatment and that the substrate was heated at a temperature of 120° C. (lower than the glass transition temperature of the underlayer) in the step of sintering silver nanoparticles.

Comparative Example 5

An Ag thin film was formed in the same manner as in Example 12 except that the substrate was heated at a temperature of 120° C. in the step of sintering silver nanoparticles.

(Measurement of Scratch Resistance) For each of the Ag thin films of Examples and Comparative Examples, the scratch resistance was measured using an ultra-thin film scratch tester (CSR-2000, manufactured by RHESCA Co. Ltd.) so as to evaluate the adhesion of the Ag thin film in the conductive structure. The scratch resistance was measured under the following conditions, and the average of three measurement values was calculated. Table 1 shows the results.

Stylus: curvature radius of 100 μm
Applied load: 0 to 120 mN
Measured distance: 1 mm
Scratch speed: 10 μm/s

TABLE 1

| | Surface treatment of underlayer | | Silver nanoparticle ink | Scratch resistance [N] (Upper row: PMMA) (Lower row: PVP) |
|---|---|---|---|---|
| | Oxygen plasma treatment | Annealing temperature [° C.] | Sintering temperature [° C.] | |
| Example 1 | Yes | 40 | 150 | 55 |
| Example 2 | | | | 61 |
| Example 3 | Yes | 60 | 150 | 60 |
| Example 4 | | | | 71 |
| Example 5 | Yes | 80 | 150 | 64 |
| Example 6 | | | | 70 |
| Example 7 | Yes | 100 | 150 | 65 |
| Example 8 | | | | 90 |
| Example 9 | Yes | 120 | 150 | 98 |
| Example 10 | | | | 110 |
| Example 11 | Yes | 140 | 150 | 75 |
| Example 12 | | | | 125 |
| Example 13 | Yes | 160 | 150 | 65 |
| Example 14 | | | | 95 |
| Example 15 | Yes | 180 | 150 | 60 |
| Example 16 | | | | 80 |
| Example 17 | Yes | 200 | 150 | 60 |
| Example 18 | | | | 60 |
| Ref. Example 1 | No | — | 150 | 34 |
| Ref. Example 2 | | | | 36 |
| Ref. Example 3 | Yes | — | 150 | 48 |
| Ref. Example 4 | | | | 55 |
| Com. Example 1 | No | — | 120 | 28 |
| Com. Example 2 | | | | 29 |
| Com. Example 3 | Yes | — | 120 | 27 |
| Com. Example 4 | | | | 31 |
| Com. Example 5 | Yes | 140 | 120 | 56 (PVP) |

In either the PMMA underlayer or the PVP underlayer, the surface energy thereof increased from about 30 mN/m to 50 mN/m or more when the surface of the underlayer was subjected to an oxygen plasma treatment. These results confirmed that the molecular bonds of organic molecules were broken and the wettability of the surface changed. The contact angles of water and methylene iodide on the underlayer were measured respectively and the surface energy was calculated from these contact angles by the Owens-Wendt method.

As shown in Table 1, the scratch resistance increased as the temperature of the annealing treatment after the oxygen plasma treatment increased. This means that the adhesion strength between the Ag thin film and the underlayer increased. This is probably because the annealing treatment after the oxygen plasma treatment enhanced the lyophilicity of the surface of the underlayer at the molecular level and thus the contact area between the silver nanoparticle ink and the surface of the underlayer increased. The highest scratch resistance was obtained when the annealing was performed at a temperature slightly lower than the glass transition temperature Tg of the underlayer (PMMA: about 120° C., PVP: about 140° C.). Example 12 exhibited a scratch resistance of 120 N or more. The scratch resistance had a tendency to decrease when the annealing temperature was higher than the glass transition temperature Tg of the underlayer.

When the oxygen plasma treatment of the underlayer was not performed and the coating film of the silver nanoparticle ink was sintered at a temperature lower than the glass transition temperature of the underlayer (Comparative Examples 1 and 2), the scratch resistance was less than 30 N. When only the oxygen plasma treatment was additionally performed (Comparative Examples 3 and 4), the scratch resistance was enhanced very little. As can be understood from the result of Comparative Example 5, the scratch resistance was enhanced by performing the annealing treatment after the oxygen plasma treatment.

Reference Examples 1 to 4 correspond to Comparative Examples 1 to 4 respectively except that the sintering temperature was 150° C. in Reference Examples. The scratch resistance was undoubtedly enhanced by setting the sintering temperature of the coating film of the silver nanoparticle ink to a temperature equal to or higher than the glass transition temperature of the underlayer. As can be understood from the comparison between Reference Example 1 and Reference Example 3 or the comparison between Reference Example 2 and Reference Example 4, the scratch resistance was increased about 1.5 times by the oxygen plasma treatment in Reference Examples.

Furthermore, as can be understood from the comparison between Reference Examples and Examples, the scratch resistance was significantly enhanced by performing the annealing treatment after the oxygen plasma treatment. The scratch resistance was dramatically enhanced by setting the temperature of the annealing treatment to a temperature slightly lower than the glass transition temperature of the underlayer. The scratch resistance was increased up to more than 4 times (from Comparative Example 2 to Example 12) by performing the annealing treatment after the oxygen plasma treatment and in addition, by setting the sintering temperature of the coating film of the silver nanoparticle ink to a temperature equal to or higher than the glass transition temperature of the underlayer.

As can be understood from the results described above, it is not easy to significantly enhance the scratch resistance only by performing the individual steps. Probably, a combination of the plasma treatment, the annealing treatment after the plasma treatment, and the sintering at a temperature equal to or higher than the glass transition temperature Tg of the underlayer produced a synergistic effect rather than an additive effect of the individual steps.

Figure 2:
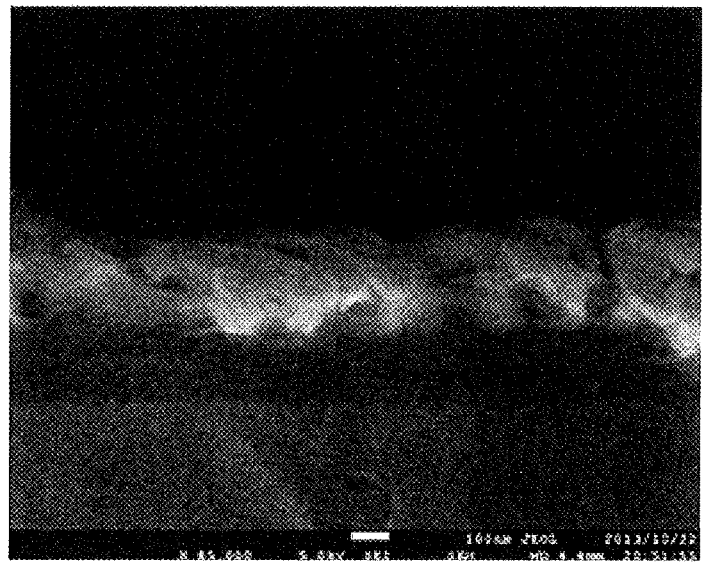
FIG. 2 is a cross-sectional scanning electron microscope (SEM) image of a conductive structure of Example 12.

FIG. 2 is a cross-sectional scanning electron microscope (SEM) image of the conductive structure of Example 12. As shown in FIG. 2, the Ag thin film (Ag) was interfused with the underlayer (PVP) (the Ag thin film (Ag) and the underlayer (PVP) were fused together) at the interface between them. This is probably because after the application of the silver nanoparticle ink, the resulting coating film was sintered at a temperature equal to or higher than the glass transition temperature Tg of the underlayer (PVP: about 140° C.) so as to sinter the silver nanoparticles and thus interfacial fusion occurred and high adhesion was achieved. It should be noted that there is a fused layer between the underlayer and the Ag thin film, although the fused layer is not clearly seen in the SEM image of FIG. 2.

Figure 3:
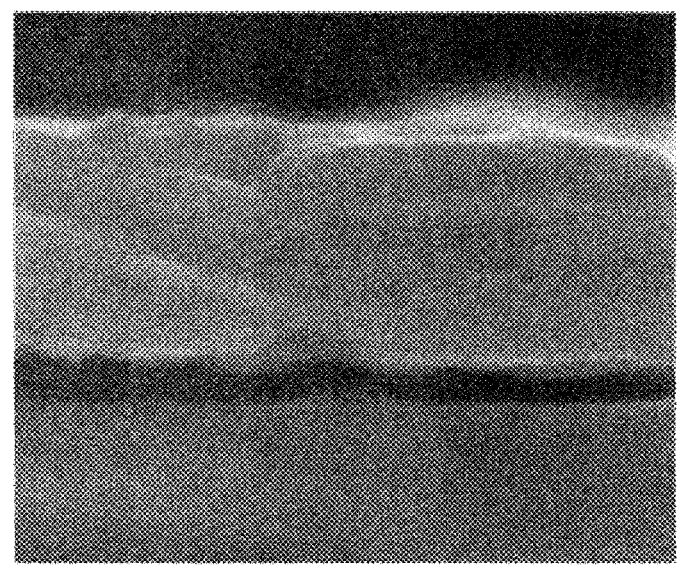
FIG. 3 is a cross-sectional SEM image of a conductive structure of Comparative Example 5.

FIG. 3 is a cross-sectional SEM image of the conductive structure of Comparative Example 5. In Comparative Example 5, after the application of the silver nanoparticle ink, the resulting coating film was sintered at a temperature lower than the glass transition temperature Tg of the underlayer so as to sinter the silver nanoparticles. As a result, the underlayer (PVP) and the Ag thin film (Ag) were not fused at their interface and peeling occurred (a "gap" shown in FIG. 3 was formed) between them. This is probably the cause of a decrease in the scratch resistance.

Reference Example 5

An Ag thin film was formed in the same manner as in Example 2 except that the oxygen plasma treatment and the annealing treatment were not performed and that the substrate was heated at a temperature of 180° C. (a temperature equal to or higher than the glass transition temperature of the underlayer) in the step of sintering silver nanoparticles.

Reference Example 6

An Ag thin film was formed in the same manner as in Reference Example 5 except that polymethyl methacrylate (PMMA) (manufactured by Sigma Aldrich Japan Co.) was used as an insulating resin instead of polyvinyl phenol (PVP).

Reference Example 7

An Ag thin film was formed in the same manner as in Reference Example 5 except that an amorphous fluororesin (AF 1600, manufactured by Du Pont-Mitsui Fluorochemicals Co., Ltd.) was used as an insulating resin instead of polyvinyl phenol (PVP). It should be noted that the glass transition temperature Tg of the amorphous fluororesin (AF 1600) is about 160° C.

(Cross-Sectional TEM Observation)

Cross sections of the conductive structures of Reference Examples 5 to 7 were each observed with a transmission electron microscope (JEM-2100FE, manufactured by JEOL Ltd., with an accelerating voltage of 200 kV). Samples for TEM observation were fabricated using a focused ion beam processing system (JEM-9320 FIB, manufactured by JEOL Ltd., with an accelerating voltage of 5 kV). FIG. 4 to FIG. 7 show the results. FIG. 5 is a partially enlarged view of FIG. 4.

Figure 4:
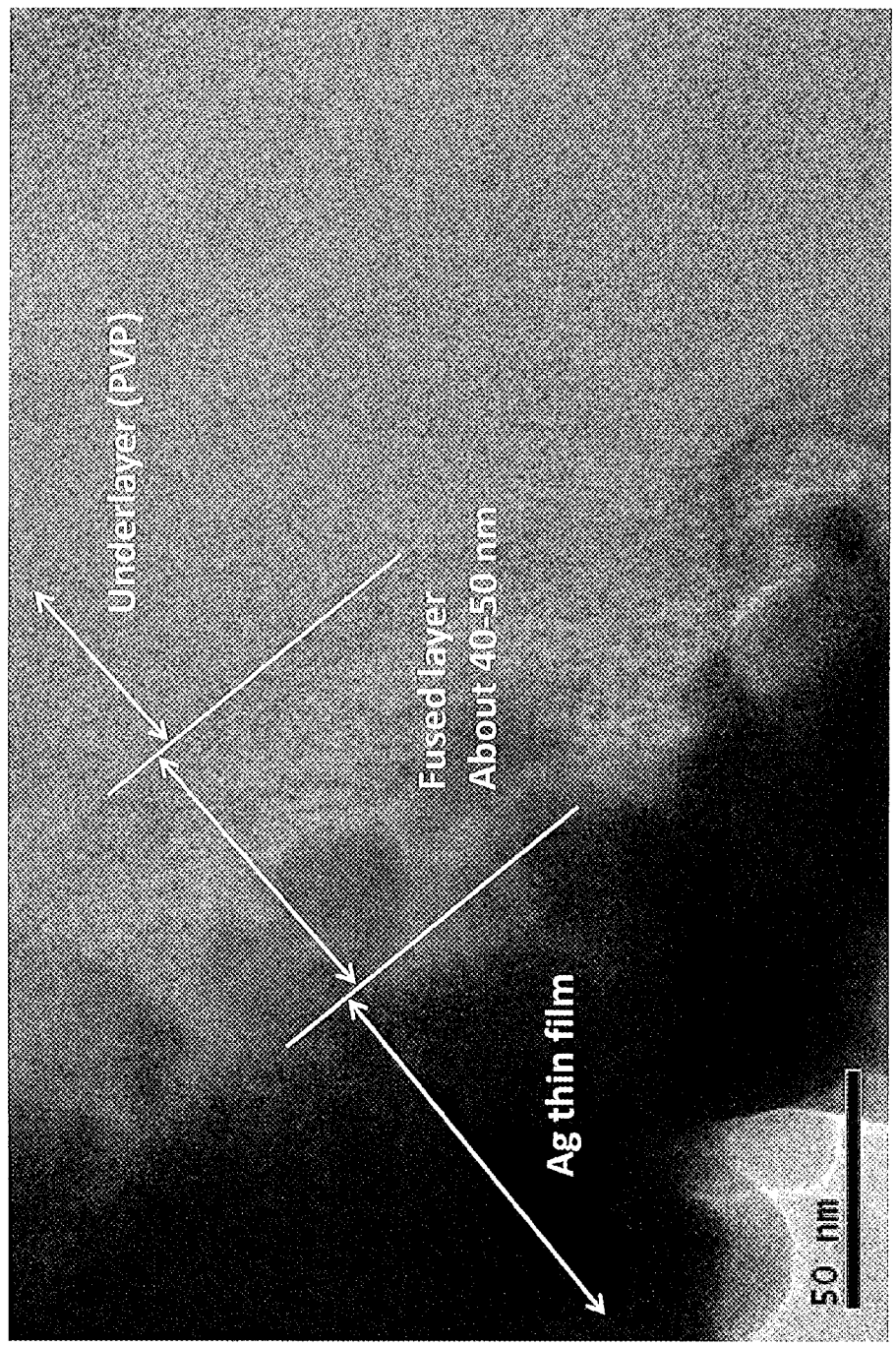
FIG. 4 is a cross-sectional transmission electron microscope (TEM) image of a conductive structure of Reference Example 5.
Figure 5:
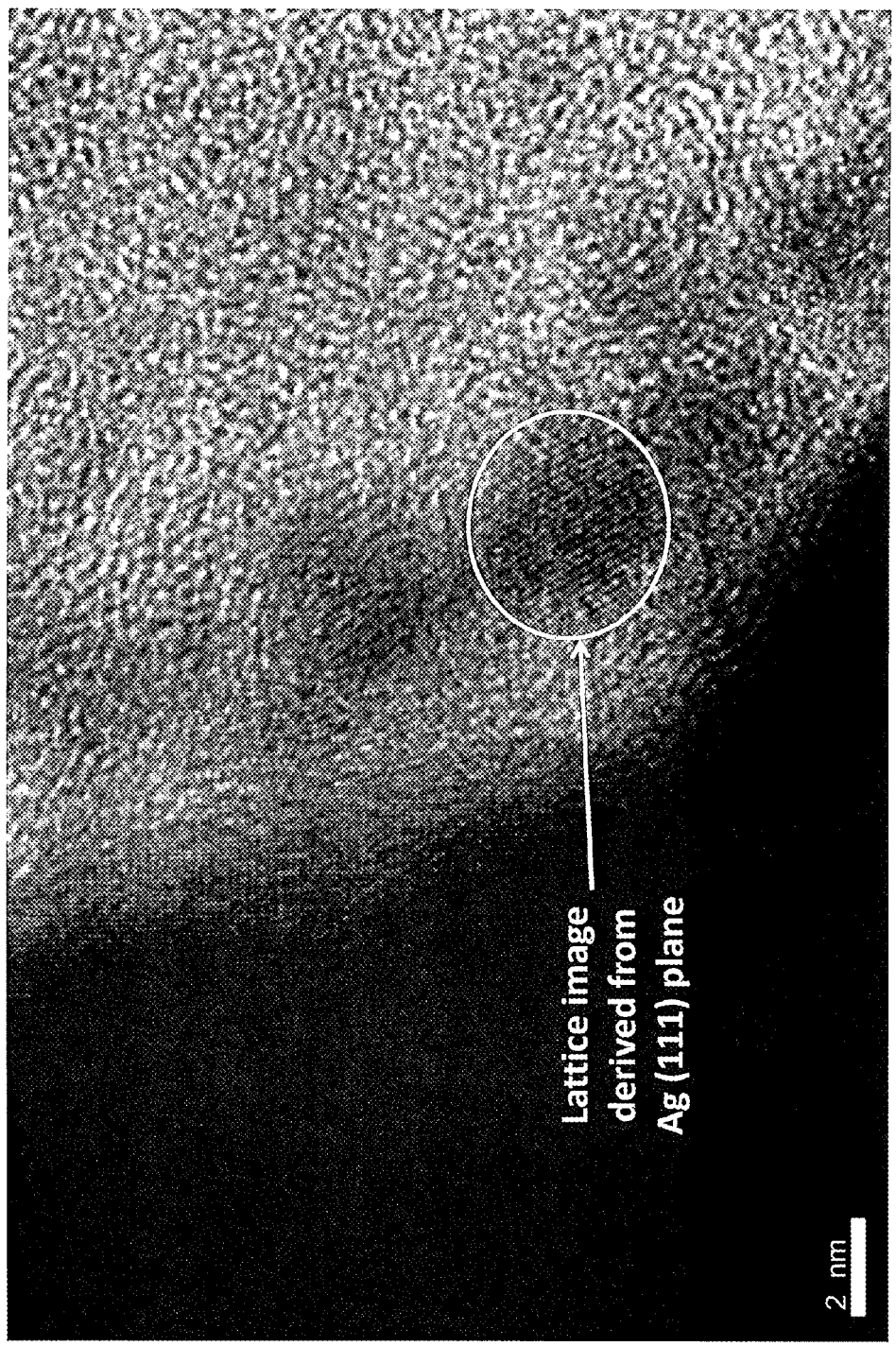
FIG. 5 is a partially enlarged view of FIG. 4.

As shown in FIG. 4, the conductive structure of Reference Example 5 had a fused layer formed between the underlayer and the Ag thin film. The thickness of the fused layer was about 40 to 50 nm when estimated from the contrast of the TEM image. As shown in the enlarged view of FIG. 5, a lattice image derived from an Ag (111) plane was observed in a region surrounded by the resin in the fused layer.

Figure 6:
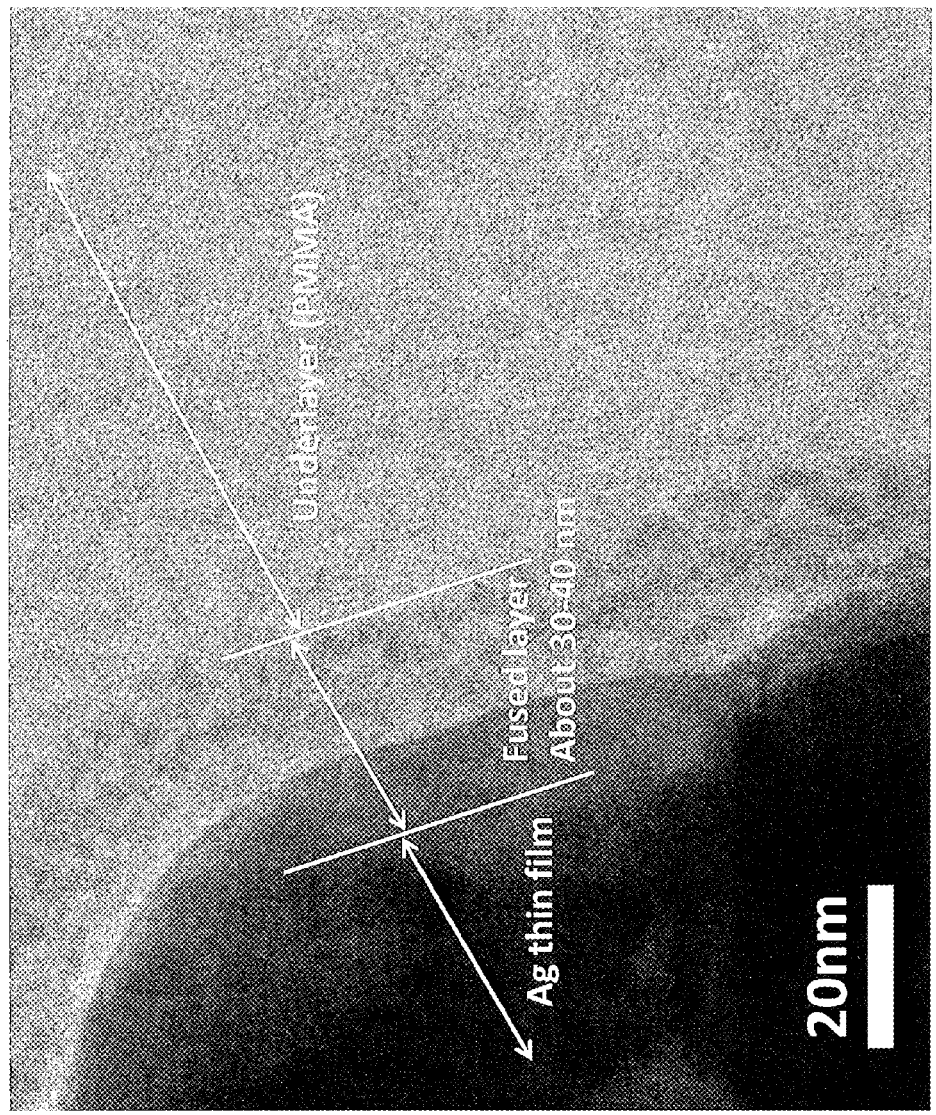
FIG. 6 is a cross-sectional TEM image of a conductive structure of Reference Example 6.
Figure 7:
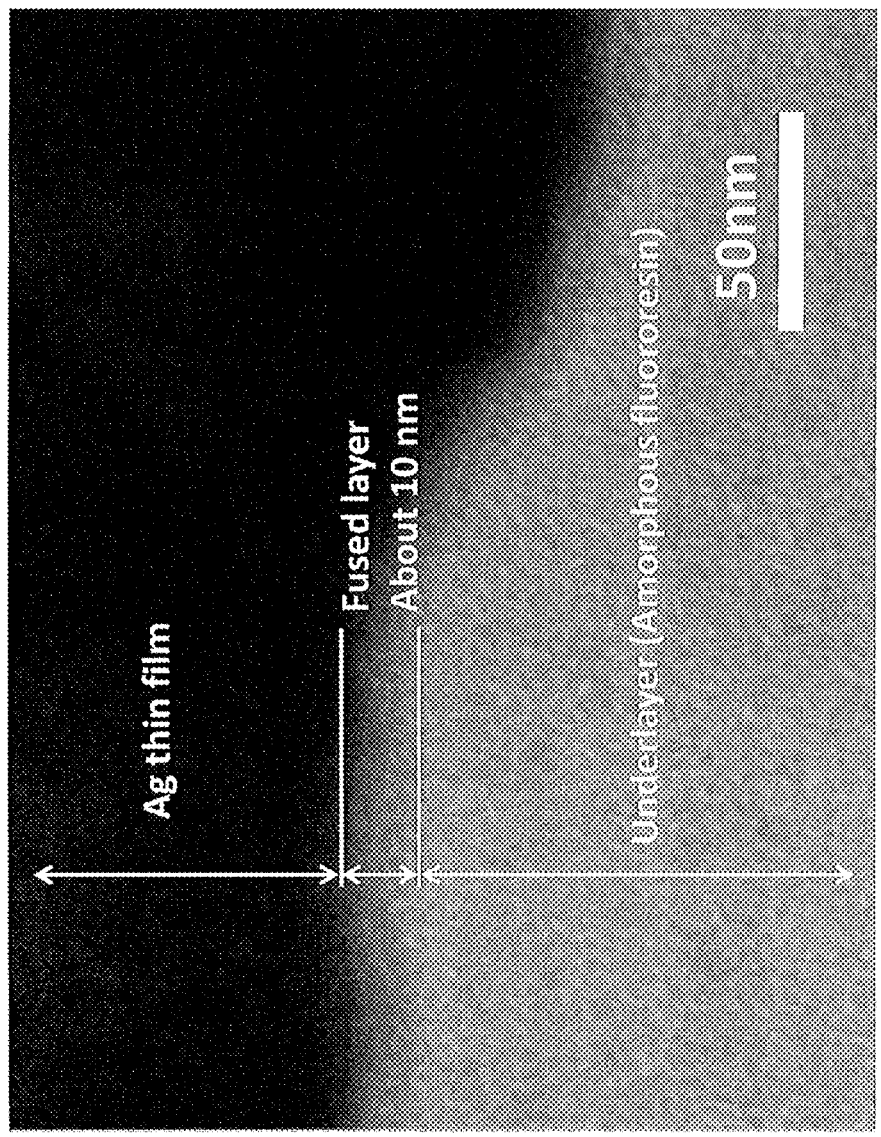
FIG. 7 is a cross-sectional TEM image of a conductive structure of Reference Example 7.

As shown in FIG. 6, a fused layer was also formed in the PMMA resin underlayer. The thickness of the fused layer was about 30 to 40 nm. As shown in FIG. 7, a fused layer was also formed in the amorphous fluororesin underlayer. The thickness of the fused layer was about 10 nm. As shown in FIG. 4 to FIG. 7, fused layers were also formed when the oxygen plasma treatment and the annealing treatment were not performed.

(XPS measurement)

Figure 8:
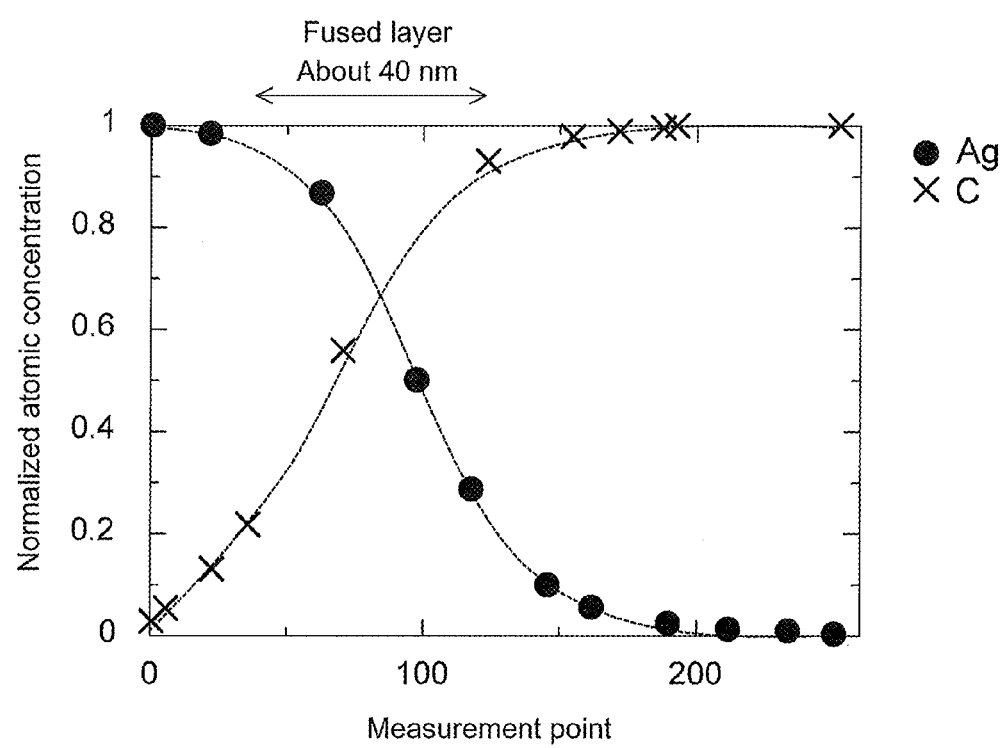
FIG. 8 is a graph showing the atomic concentrations of Ag and C in the depth direction of the conductive structure of Reference Example 5.

The elemental distribution in the depth direction of the conductive structure of Reference Example 5 was examined using an X-ray photoelectron spectrometer (5600ci, manufactured by ULVAC PHI, Inc.). The XPS measurement conditions were as follows:

Ar sputter rate: about 170 nm/min (converted value)
Measurement rate: 0.1 min per times
X-ray source: Mg
Detected elements: C, O, Ag, and F FIG. 8 is a graph obtained by measuring the atomic concentrations of Ag and C in the depth direction of the conductive structure of Reference Example 5 from the surface of the Ag thin film while etching the conductive structure in the depth direction at a sputter rate of 170 nm/min in terms of the etching rate of a silicon oxide film. In FIG. 8, the vertical axis represents the atomic concentrations of Ag normalized with respect to the intensity of 1 at the outermost surface and the atomic concentrations of C normalized with respect to the intensity of 1 at the measurement point 250 (on the horizontal axis). The horizontal axis represents the measurement points in the depth direction. As shown in FIG. 8, it is found that when PVP was used in the underlayer, a fused layer, in which both Ag and C were detected, was formed. Since the accurate etching rates of Ag, the insulating resin, and the fused layer were not known, the thickness of the fused layer could not be calculated from the result of the XPS measurement.

(Pull-Off Test)

Figure 9:
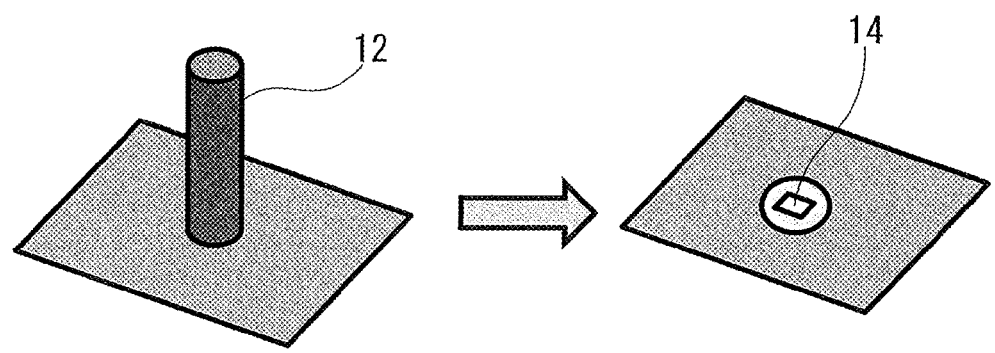
FIG. 9 is a diagram showing a pull-off test method.

A pull-off test was performed according to "Mechanical properties of coating films—Adhesion (Pull-off method)" of JIS K 5600-5-7. First, the conductive structure of Reference Example 5 was prepared in the manner as described previously. Next, as shown in FIG. 9, a rod 12 was bonded to the surface of the conductive structure of Reference Example 5 with an epoxy resin. A substrate was fixed onto a stage, and the distal end of the rod 12 was fixed to a force gauge (FGP-5, manufactured by NIDEC-SHIMPO Corporation). Then, a force was applied to the rod in the thickness direction of the Ag thin film (in the direction of pulling the rod off the Ag thin film). When the rod was pulled with a force equal to or greater than the adhesion strength of the Ag thin film, peeling occurred at the interface between the Ag thin film and the underlayer. The adhesion strength was calculated from the area of the peeled portion of the Ag thin film and the value of the force gauge. The conductive structures of Reference Example 6 and Reference Example 7 were also subjected to the same test. The surface energies of the underlayers were also measured during the fabrication of the conductive structures (after the formation of the underlayers and before the plasma treatment). Table 2 shows the results.

TABLE 2

|  | Thickness of fused layer (nm) | Adhesion strength (N/mm$^2$) | Surface energy (mN/m) |
| --- | --- | --- | --- |
| Ref. Example 5 (PVP) | 40 | 15 | 43 |
| Ref. Example 6 (PMMA) | 30 | 10 | 38 |
| Ref. Example 7 (amorphous fluororesin) | 10 | 7 | 17 |

As shown in Table 2, the adhesion strength between the Ag thin film and the underlayer tended to be proportional to the thickness of the fused layer. In addition, the adhesion strength tended to increase with increasing surface energy. In general, this tendency means that a surface with a higher surface energy has a stronger interaction with a medium in contact with that surface. As may be understood from Table 2, the interaction between the underlayer and the silver nanoparticles increased with increasing surface energy, which increased the wettability between them accordingly, and thus a fused layer was formed in a deeper region, resulting in an increase in the adhesion strength.

(Analysis of Remaining Silver after Pull-Off Test)

After the conductive structure of Reference Example 5 was subjected to the pull-off test, a specific region 14 on the surface having been in contact with the rod 12 was observed with a scanning electron microscope (SEM-EDS) (JSM-7800FE, manufactured by JEOL Ltd., with an accelerating voltage of 15 kV). The specific region 14 was a square region with an area of 1 mm$^2$.

In addition to the surface observation with a scanning electron microscope, the elements present in the specific region 14 and the concentrations of the elements were examined by energy dispersive X-ray spectroscopy (EDS). Specifically, the characteristic X-rays of the elements Ag, C, and O were detected respectively at 100 measurement points within the specific region 14, and the concentration of Ag (weight %) was calculated at each of the measurement points. Based on the calculation results, the distribution of the Ag concentrations was plotted as a histogram. In addition, the surface EDS image (Ag) of the specific region 14 was obtained.

Figure 10A:
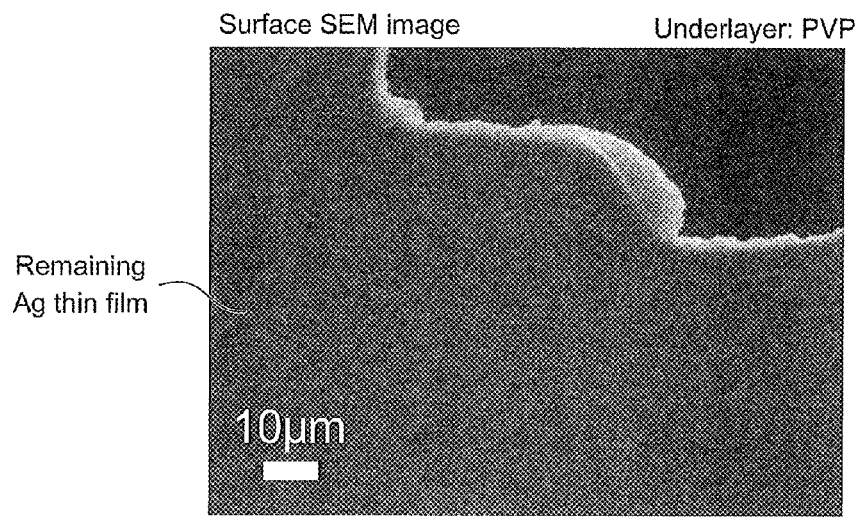
FIG. 10A is a surface SEM image of a specific region of Reference Example 5 after the pull-off test.
Figure 10B:
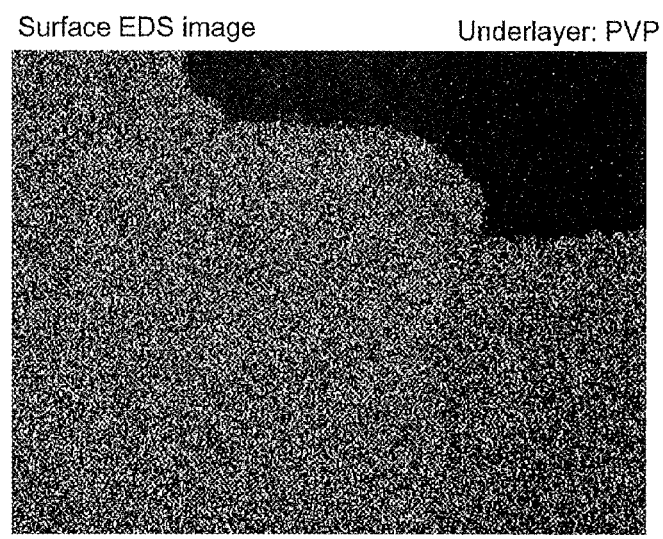
FIG. 10B is a surface EDS image of the specific region of Reference Example 5 after the pull-off test.
Figure 10C:
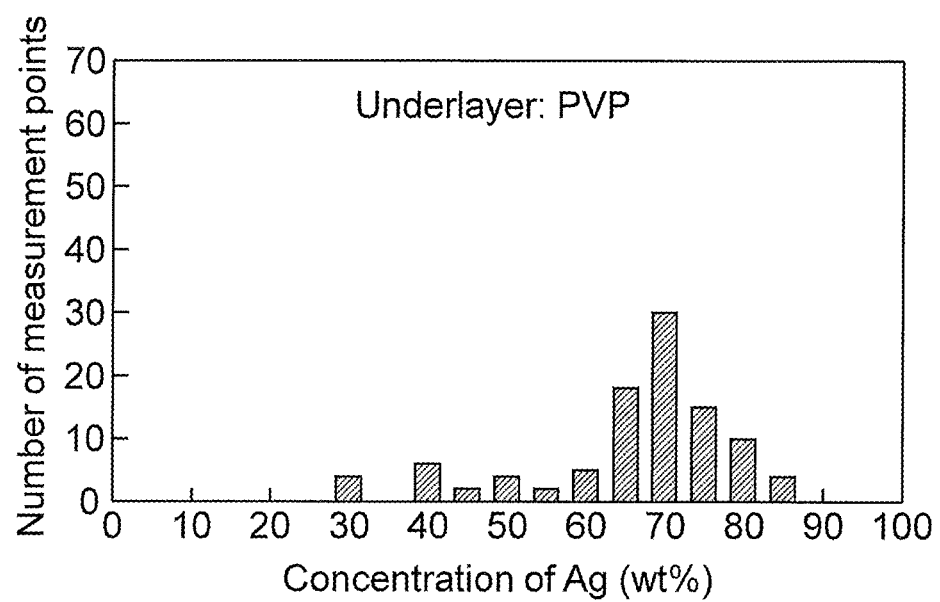
FIG. 10C is a histogram showing the distribution of Ag concentrations in the specific region of Reference Example 5 after the pull-off test.

FIG. 10A shows the result of the surface observation with a scanning electron microscope. FIG. 10B shows the surface EDS image (Ag). FIG. 10C shows a histogram showing the distribution of Ag concentrations. In FIG. 10C, the vertical axis represents the number of measurement points and the horizontal axis represents the concentration of Ag.

Figure 11A:
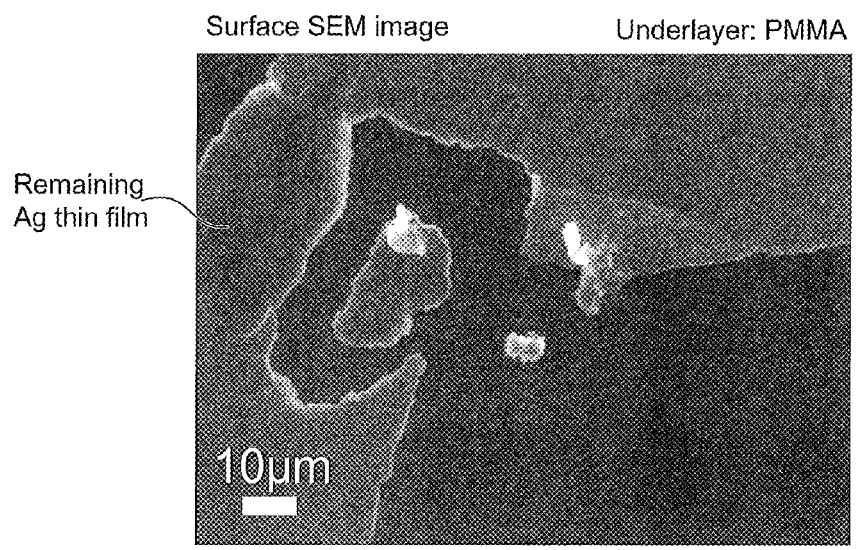
FIG. 11A is a surface SEM image of a specific region of Reference Example 6 after the pull-off test.
Figure 11B:
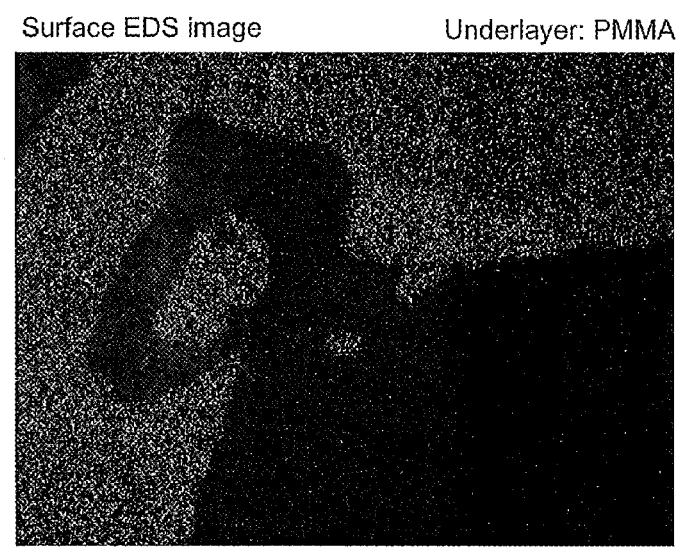
FIG. 11B is a surface EDS image of the specific region of Reference Example 6 after the pull-off test.
Figure 11C:
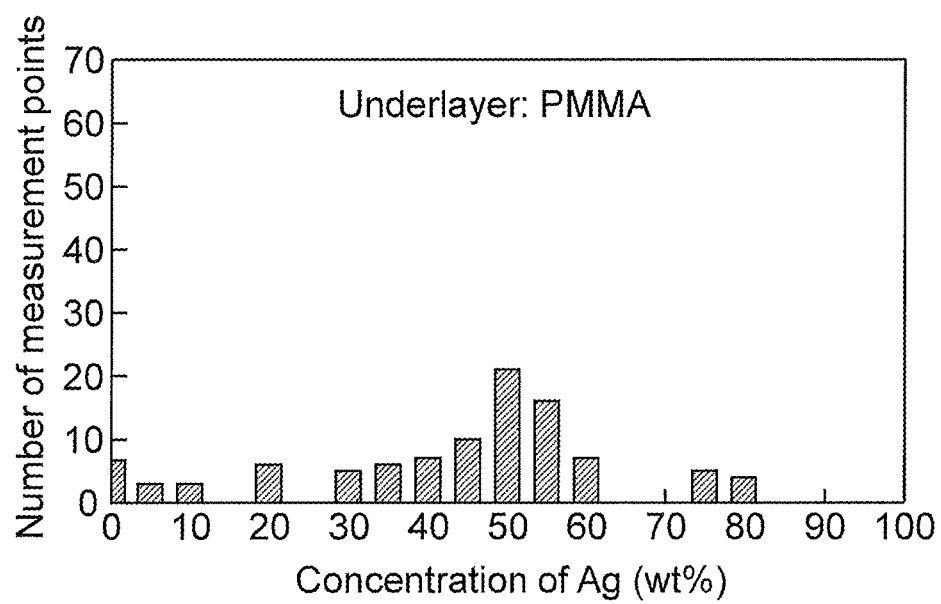
FIG. 11C is a histogram showing the distribution of Ag concentrations in the specific region of Reference Example 6 after the pull-off test.
Figure 12A:
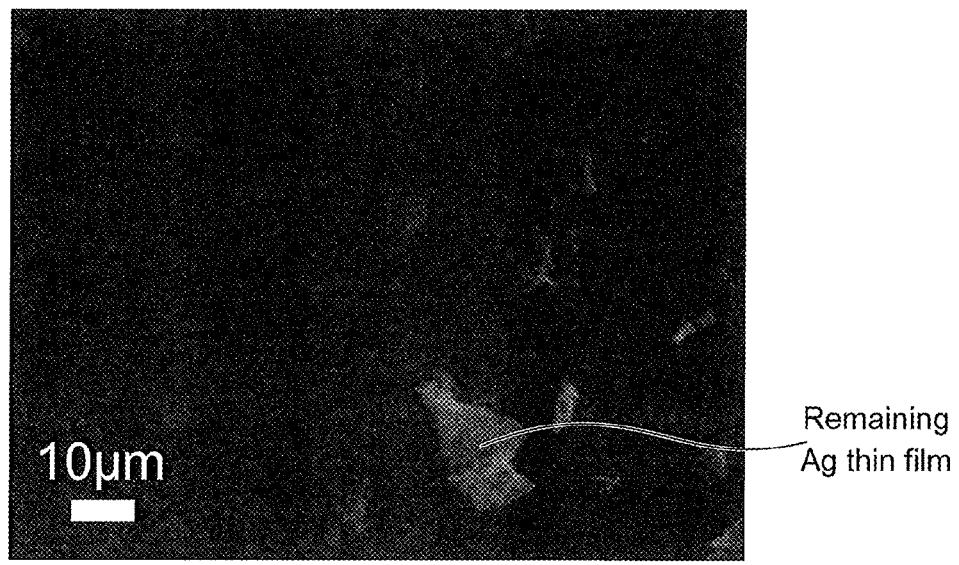
FIG. 12A is a surface SEM image of a specific region of Reference Example 7 after the pull-off test.
Figure 12B:
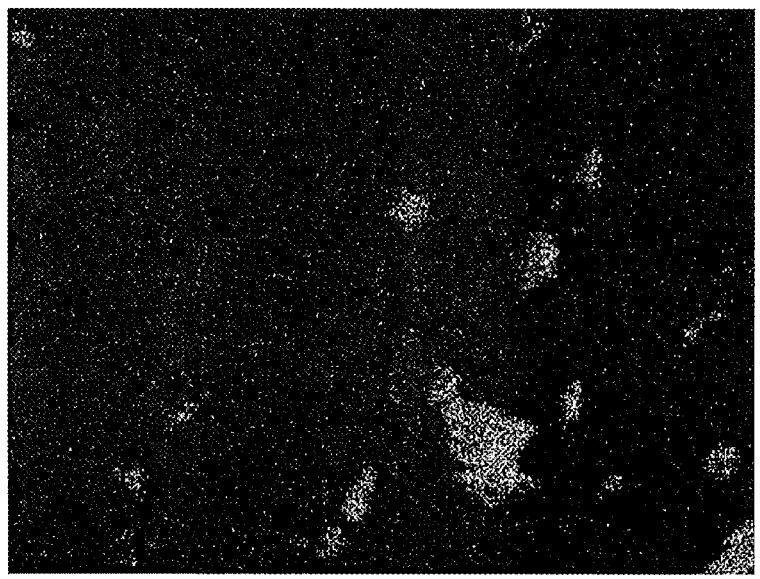
FIG. 12B is a surface EDS image of the specific region of Reference Example 7 after the pull-off test.
Figure 12C:
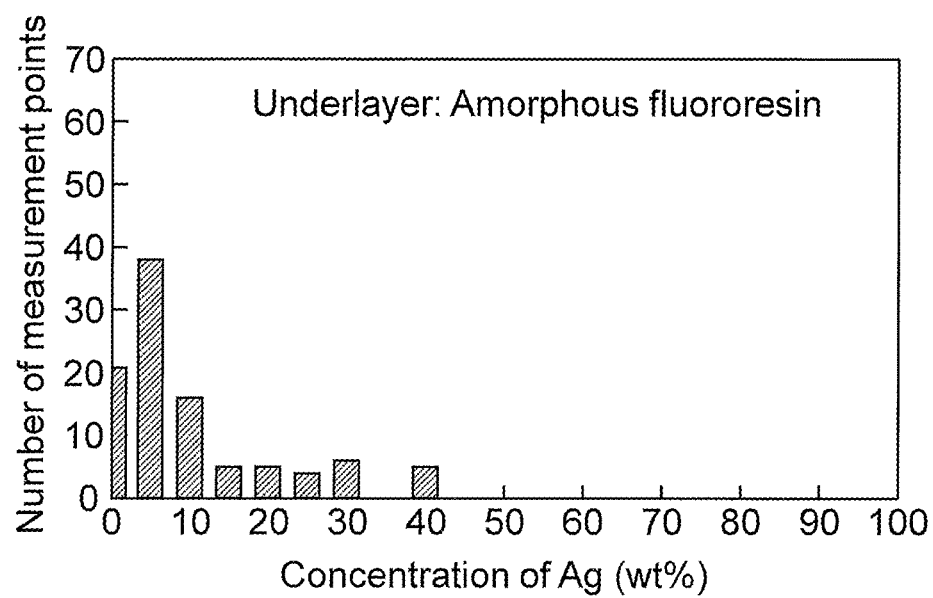
FIG. 12C is a histogram showing the distribution of Ag concentrations in the specific region of Reference Example 7 after the pull-off test.

Furthermore, the surface SEM images and surface EDS images of Reference Example 6 and Reference Example 7 were obtained as in Reference Example 5, and histograms showing the Ag concentrations were prepared. FIG. 11A to FIG. 11C show the results for Reference Example 6. FIG. 12A to FIG. 12C show the results for Reference Example 7.

As can be understood from FIG. 10A to FIG. 10C, in all the conductive structures of Reference Example 5 to Reference Example 7, Ag still remained on the surface after the Ag thin film was pulled. This means that the Ag thin film and the underlayer were firmly bonded together by the formation of the fused layer. In Reference Example 5 including a PVP underlayer, a sufficient amount of Ag remained on the underlayer. As can be understood from FIG. 11A to FIG. 11C, in Reference Example 6 including a PMMA underlayer, a sufficient amount of Ag remained on the underlayer, although the amount of Ag remained was smaller than that in Reference Example 5. As can be understood from FIG. 12A to FIG. 12C, in Reference Example 7 including an amorphous fluororesin underlayer, only a small amount of Ag remained on the underlayer.

Figure 13:
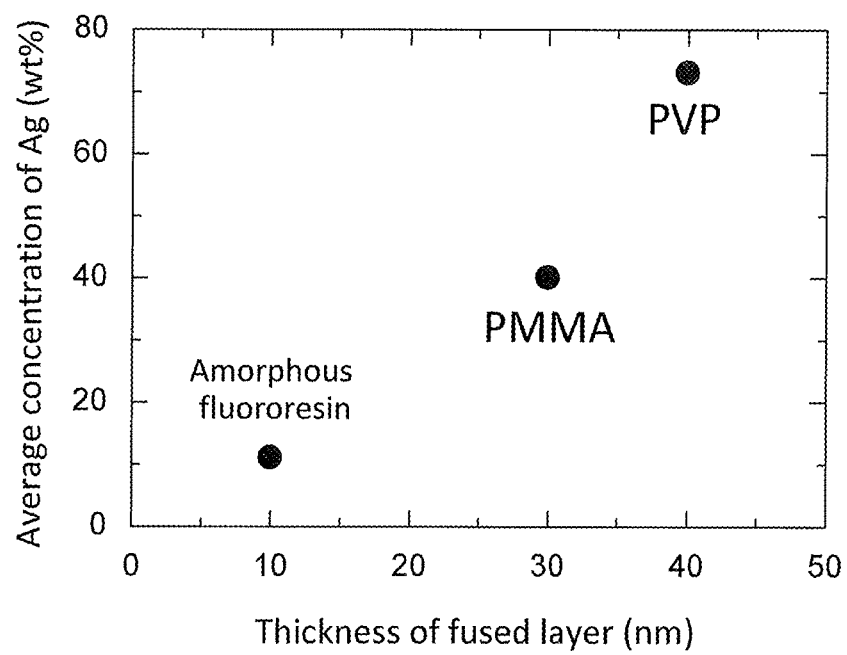
FIG. 13 is a graph showing the relationship between the average concentration of Ag and the thickness of a fused layer.

FIG. 13 is a graph showing the relationship between the average concentration of Ag and the thickness of the fused layer. As shown in FIG. 13, the concentration of Ag increased as the thickness of the fused layer increased.

Example 20

An Ag thin film was formed in the same manner as in Example 12 except that the sintering temperature of the coating film of the silver nanoparticle ink was set at 180° C.

Example 21

An Ag thin film was formed in the same manner as in Example 9 except that the sintering temperature of the coating film of the silver nanoparticle ink was set at 180° C.

Example 22

An Ag thin film was formed in the same manner as in Example 21 except that an amorphous fluororesin (AF 1600, manufactured by Du Pont-Mitsui Fluorochemicals Co., Ltd.) was used as an insulating resin instead of polyvinyl phenol (PVP) and that the temperature of the annealing treatment after the oxygen plasma treatment was set at 160° C.

Figure 14:
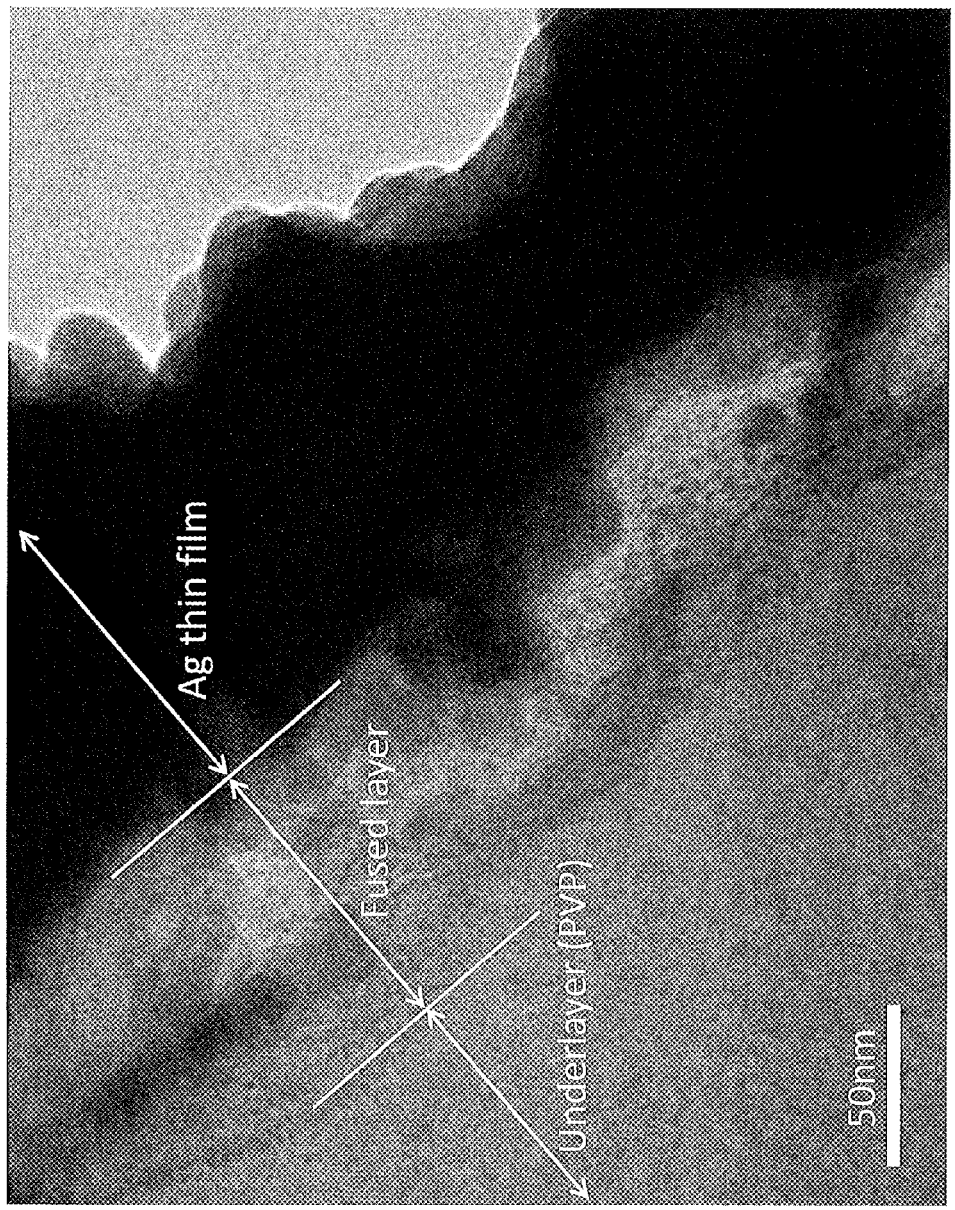
FIG. 14 is a cross-sectional TEM image of a conductive structure of Example 20.

FIG. 14 shows a cross-sectional TEM image of the conductive structure of Example 20. The TEM observation was performed under the same conditions as those of the TEM observation of Reference Examples. As shown in FIG. 14, the boundary between the Ag thin film and the underlayer was not clear, which probably means that a sufficiently thick fused layer was also formed in the conductive structure of Example 20. As can be understood from the comparison between FIG. 4 and FIG. 14, a fused layer was formed regardless of whether or not the oxygen plasma treatment and the annealing treatment were performed. That is, the previous description of Reference Examples 5 to 7 can be applied to Examples 20 to 22.

Figure 15:
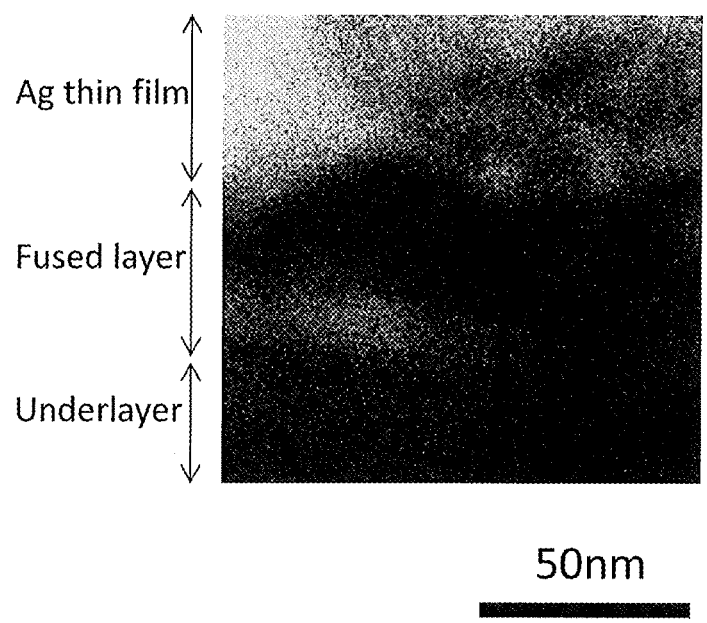
FIG. 15 is an EDS image showing the distribution of Ag in a region near the interface between an Ag thin film and an underlayer.

In addition to the cross-sectional TEM observation, the energy dispersive X-ray spectroscopy was performed on the region near the interface between the Ag thin film and the underlayer. Specifically, the elemental analysis of Ag, C, and O was performed. As a result, C and O were uniformly distributed throughout the analyzed region. FIG. 15 shows the EDS image of the distribution of Ag. As can be understood from FIG. 15, Ag penetrated into the underlayer so as to form a fused layer.

(Analysis of Remaining Silver after Pull-Off Test)

Figure 16A:
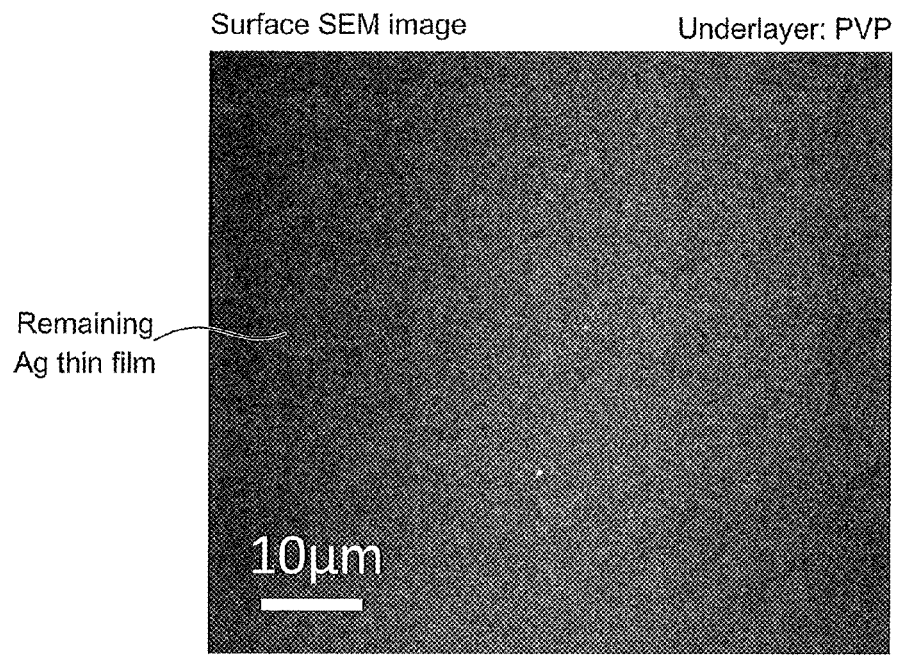
FIG. 16A is a surface SEM image of a specific region of Example 20 after the pull-off test.
Figure 16B:
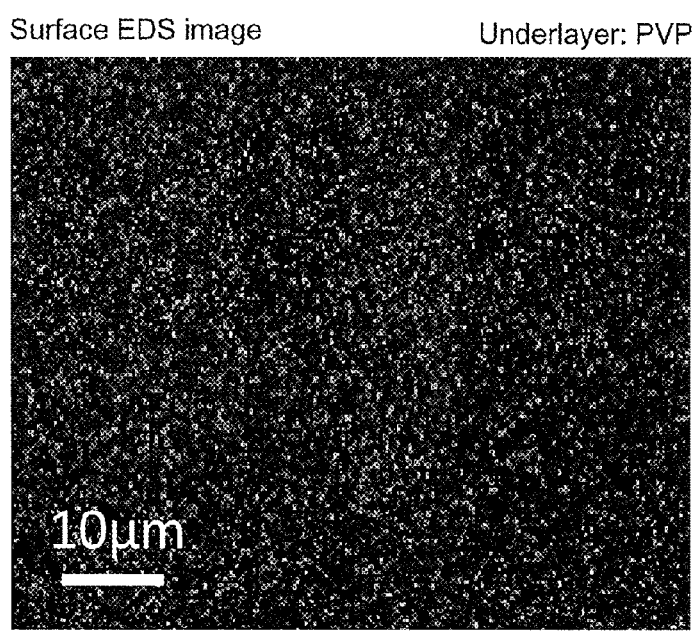
FIG. 16B is a surface EDS image of the specific region of Example 20 after the pull-off test.
Figure 16C:
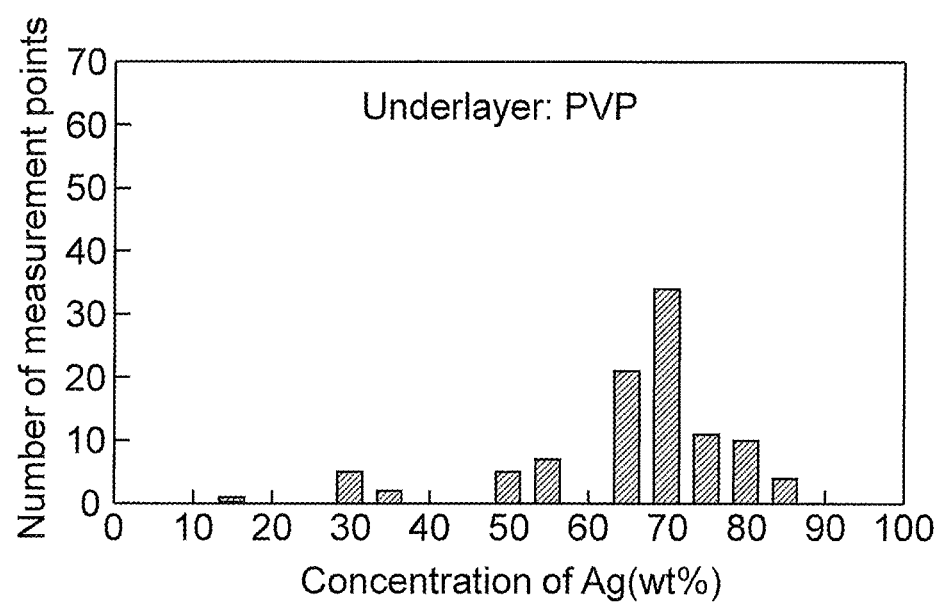
FIG. 16C is a histogram showing the distribution of Ag concentrations in the specific region of Example 20 after the pull-off test.
Figure 17A:
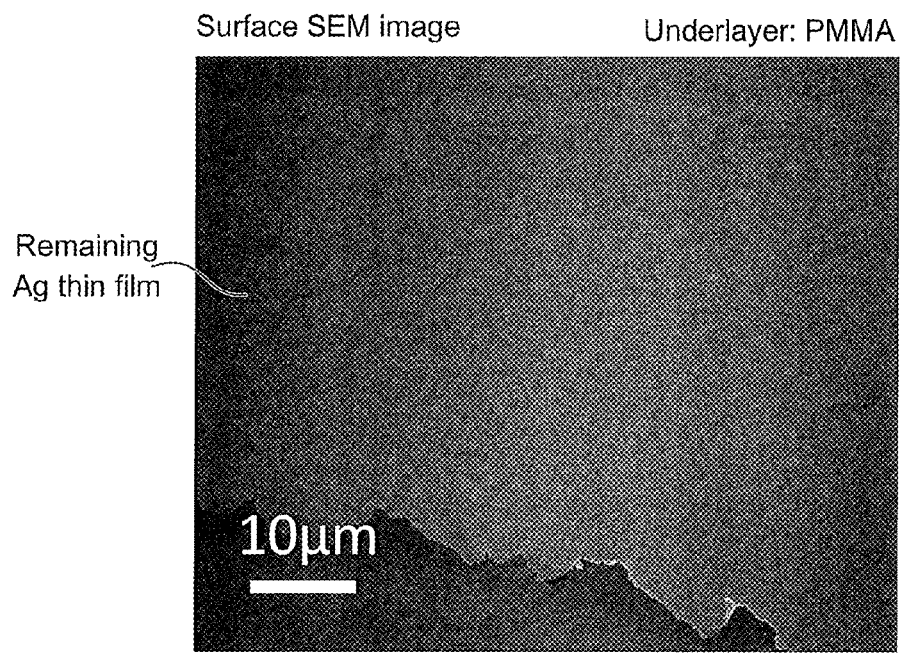
FIG. 17A is a surface SEM image of a specific region of Example 21 after the pull-off test.
Figure 17B:
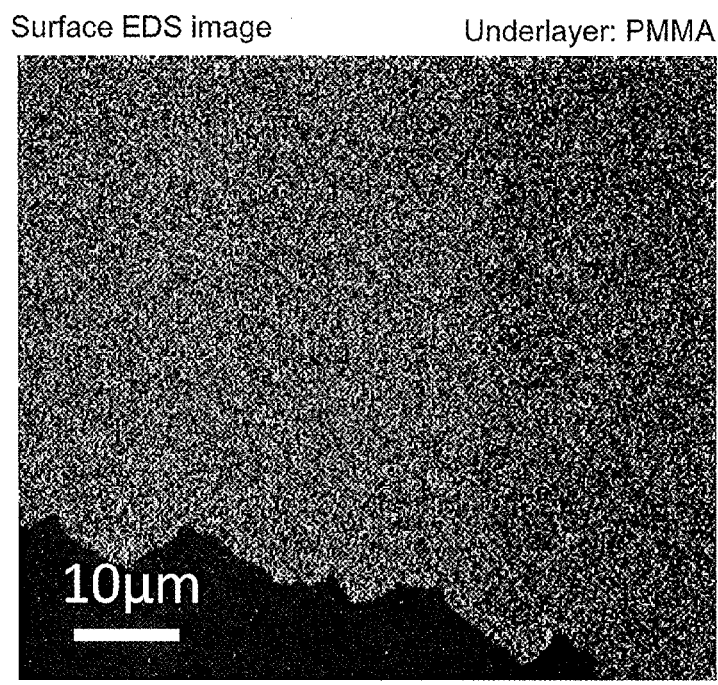
FIG. 17B is a surface EDS image of the specific region of Example 21 after the pull-off test.
Figure 17C:
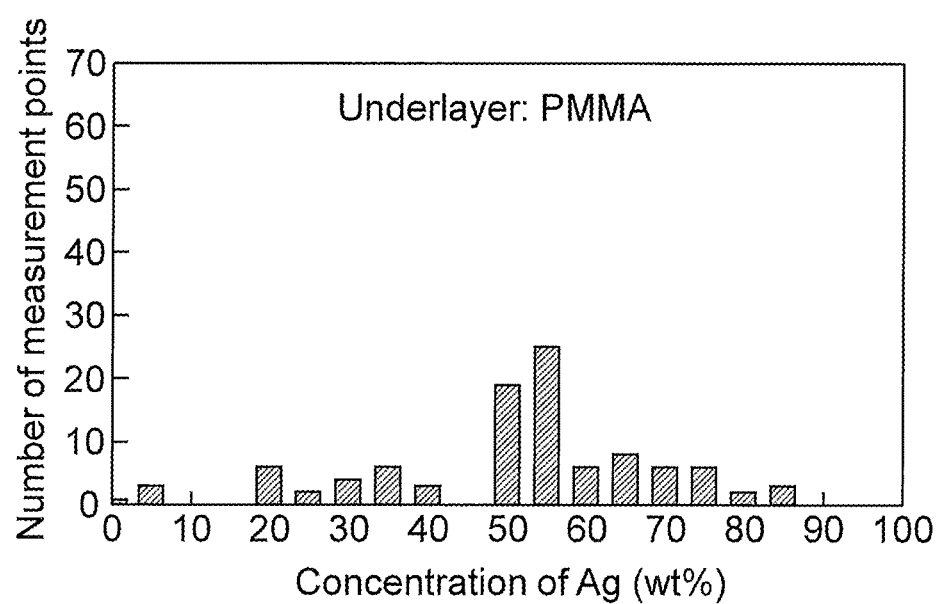
FIG. 17C is a histogram showing the distribution of Ag concentrations in the specific region of Example 21 after the pull-off test.
Figure 18A:
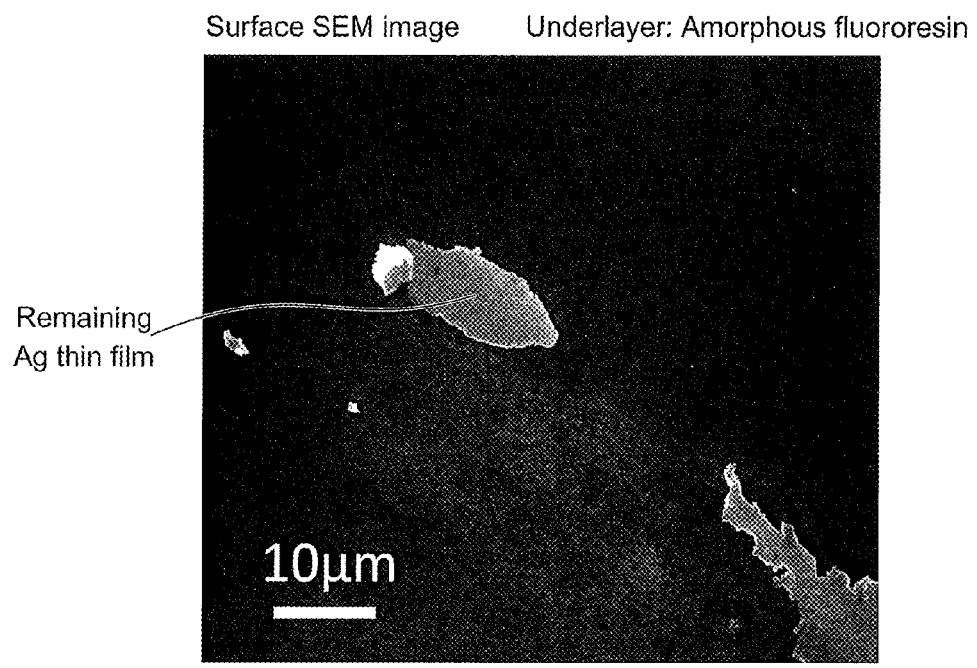
FIG. 18A is a surface SEM image of a specific region of Example 22 after the pull-off test.
Figure 18B:
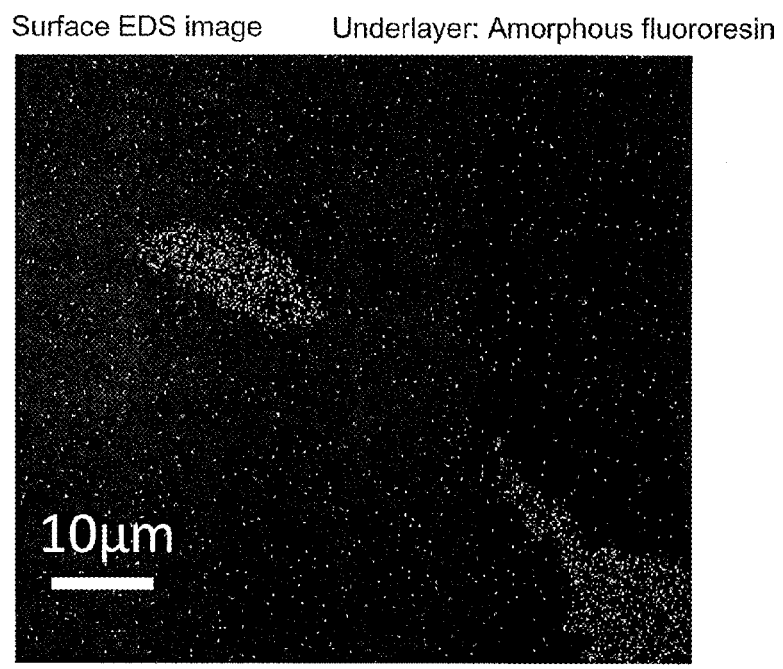
FIG. 18B is a surface EDS image of the specific region of Example 22 after the pull-off test.
Figure 18C:
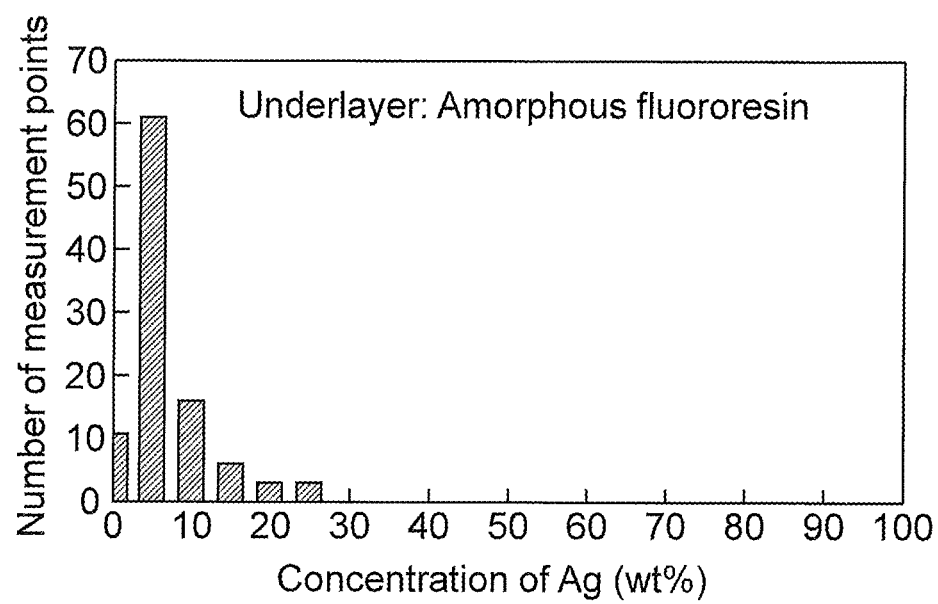
FIG. 18C is a histogram showing the distribution of Ag concentrations in the specific region of Example 22 after the pull-off test.

The conductive structures of Examples 20 to 22 were subjected to the pull-off test in the same manner as in Reference Examples. Then, the surface SEM images, the surface EDS images, and the histograms showing the Ag concentrations were obtained in the same manner as in Reference Examples. FIG. 16A to FIG. 16C show the results for Example 20. FIG. 17A to FIG. 17C show the results for Example 21. FIG. 18A to FIG. 18C show the results for Example 22.

As can be understood from FIG. 16A to FIG. 18C, Examples 20 to 22 had the same tendency as Reference Example 5 to 7. This fact also suggests that the previous description of Reference Examples 5 to 7 can be applied to Examples 20 to 22.

The invention claimed is:

1. A method for producing a metal thin film, comprising, in the following order, the steps of:
   preparing a substrate having thereon an underlayer formed of an insulating resin;
   subjecting a surface of the underlayer to a physical surface treatment for breaking bonds of organic molecules constituting the insulating resin;
   subjecting the substrate to a heat treatment at a temperature of 50° C. or more and 200° C. or lower;
   applying a metal nanoparticle ink to the underlayer; and
   sintering metal nanoparticles contained in the metal nanoparticle ink at a temperature equal to or higher than a glass transition temperature of the underlayer and thereby forming a fused layer that fuses the underlayer and a metal thin film together at an interface therebetween, the metal thin film being formed by sintering the metal nanoparticles.

2. The method for producing a metal thin film according to claim 1, wherein the physical surface treatment is a treatment for breaking the bonds of the organic molecules with bonding energies of 200 to 1000 kJ/mol.

3. The method for producing a metal thin film according to claim 1, wherein the physical surface treatment includes at least one treatment selected from the group consisting of an oxygen plasma treatment, an argon plasma treatment, a nitrogen plasma treatment, an ultraviolet irradiation treatment, and an ultraviolet-ozone treatment.

4. The method for producing a metal thin film according to claim 1, wherein the substrate is heated at a temperature equal to or lower than the glass transition temperature of the underlayer in the step of subjecting the substrate to the heat treatment.

5. The method for producing a metal thin film according to claim 1, wherein the insulating resin is a thermoplastic resin, and
the glass transition temperature of the underlayer is 200° C. or lower.

6. The method for producing a metal thin film according to claim 1, wherein after the substrate is subjected to the heat treatment and before the metal nanoparticle ink is applied, the surface of the underlayer has a surface energy of 15 mN/m or more.

7. The method for producing a metal thin film according to claim 1, wherein the insulating resin includes at least one selected from the group consisting of polymethyl methacrylate, polyvinyl phenol, polystyrene, polyvinyl alcohol, polyethylene, polypropylene, polycarbonate, polyethylene terephthalate, polyethylene naphthalate, polysulfone, polyether sulfone, polyarylate, polyamide, and thermoplastic fluororesins.

8. The method for producing a metal thin film according to claim 1, wherein the fused layer contains the insulating resin forming the underlayer and metal atoms constituting the metal thin film.

9. The method for producing a metal thin film according to claim 1, wherein the physical surface treatment is a treatment that enhances the wettability of the surface of the underlayer.

10. The method for producing a metal thin film according to claim 1, wherein the fused layer comprises one or more structures selected from the group consisting of:
    a structure in which the metal nanoparticles and the insulating resin are uniformly mixed,
    a structure in which a concentration of the metal nanoparticles decreases gradually in a thickness direction of the fused layer, and
    a structure comprising a first region where the silver nanoparticles and the insulating resin are phase-separated and a second region where the silver nanoparticles and the insulating resin are uniformly mixed.

11. A method for producing a conductive structure,
    the conductive structure comprising:
        a substrate having thereon an underlayer formed of an insulating resin;
        a metal thin film supported on the underlayer; and
        a fused layer formed between the underlayer and the metal thin film, the fused layer having a thickness of 100 nm or less,
    the method comprising: forming the metal thin film and the fused layer by the method according to claim 1.

12. The method for producing a conductive structure according to claim 11, wherein the fused layer is a layer containing the insulating resin forming the underlayer and metal atoms constituting the metal thin film.

13. The method for producing a conductive structure according to claim 11, wherein the thickness of the fused layer is 10 nm or more.

14. A method for producing a thin-film transistor, comprising:
    forming a conductive structure by the method according to claim 11.

15. A method for producing an integrated circuit, comprising:
    forming a thin-film transistor by the method according to claim 14.

16. A conductive structure comprising:
    a substrate having thereon an underlayer formed of an insulating resin;
    a metal thin film supported on the underlayer, the metal thin film being a sintered layer of silver nanoparticles; and a fused layer formed between the underlayer and the metal thin film and having a thickness of 100 nm or less, the fused layer containing the insulating resin forming the underlayer and silver atoms constituting the metal thin film, wherein when a cross section of the conductive structure is observed with a transmission electron microscope, a lattice image derived from Ag (111) planes is observed in a region surrounded by the insulating resin in the fused layer.

17. The conductive structure according to claim 16, wherein the fused layer comprises one or more structures selected from the group consisting of:
   a structure in which the silver nanoparticles and the insulating resin are uniformly mixed,
   a structure in which a concentration of the silver nanoparticles decreases gradually in a thickness direction of the fused layer, and
   a structure comprising a first region where the silver nanoparticles and the insulating resin are phase-separated and a second region where the silver nanoparticles and the insulating resin are uniformly mixed.

* * * * *